United States Patent
Dozier, II et al.

(10) Patent No.: US 6,669,489 B1
(45) Date of Patent: Dec. 30, 2003

(54) INTERPOSER, SOCKET AND ASSEMBLY FOR SOCKETING AN ELECTRONIC COMPONENT AND METHOD OF MAKING AND USING SAME

(75) Inventors: Thomas H. Dozier, II, Carrolton, TX (US); Benjamin N. Eldridge, Danville, CA (US); Gary W. Grube, Pleasanton, CA (US); Igor Y. Khandros, Orinda, CA (US); Gaetan L. Mathieu, Dublin, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 09/107,924

(22) Filed: Jun. 30, 1998

Related U.S. Application Data

(63) Continuation of application No. 08/533,584, filed on Oct. 18, 1995, now Pat. No. 5,772,451, which is a continuation-in-part of application No. 08/452,255, filed on May 26, 1995, now Pat. No. 6,336,269, which is a continuation-in-part of application No. PCT/US94/13373, filed on Nov. 16, 1994, and a continuation-in-part of application No. 08/340,144, filed on Nov. 15, 1994, now Pat. No. 5,917,707, which is a continuation-in-part of application No. 08/152,812, filed on Nov. 16, 1993, now Pat. No. 5,476,211, application No. 09/107,924, which is a continuation-in-part of application No. 08/526,246, filed on Sep. 21, 1995, now abandoned.

(51) Int. Cl.[7] .............................................. H01R 12/00
(52) U.S. Cl. ............................. 439/71; 439/83; 439/66; 439/886
(58) Field of Search .............................. 439/70–73, 83, 439/66, 74, 68, 886

(56) References Cited

U.S. PATENT DOCUMENTS

| | | |
|---|---|---|
| 3,290,636 A | 12/1966 | Overtveld |
| 3,509,270 A | 4/1970 | Dube et al. |
| 3,616,532 A | 11/1971 | Beck |

(List continued on next page.)

FOREIGN PATENT DOCUMENTS

| | | |
|---|---|---|
| EP | 145327 | 6/1985 |
| FR | 2643753 | 2/1989 |
| FR | 2680284 | 2/1993 |

(List continued on next page.)

OTHER PUBLICATIONS

Jarvela, "Module Holder And Actuator," IBM Technical Disclosure Bulletin, vol. 16, No. 1, pp. 3975–3976, May 1974.

Falda, "Pluggable Stacked Module," IBM Technical Disclosure Bulletin, vol. 23 No. 12 (May 1981).

"Bimetal VLSI Chip Interconnections," IBM Technical Disclosure Bulletin, vol. 29. No. 11, pp. 5021–22 (Apr. 1987).

(List continued on next page.)

*Primary Examiner*—Gary Paumen
(74) *Attorney, Agent, or Firm*—N. Kenneth Burraston; Stuart L. Merkadeau

(57) ABSTRACT

Surface-mount, solder-down sockets permit electronic components such as semiconductor packages to be releasably mounted to a circuit board or other electronic component. In an embodiment, resilient contact structures extend through a support substrate, and solder-ball (or other suitable) contact structures are disposed along the bottom of the support substrate in electrical contact with the ends of the resilient contact structures. Composite interconnection elements are used as the resilient contact structures disposed atop the support substrate. In an embodiment intended to receive an LGA-type semiconductor package, pressure contact is made between the resilient contact structures and external connection points of the semiconductor package with a contact force which is generally normal to the top surface of the support substrate. In an embodiment intended to receive a BGA-type semiconductor package, pressure contact is made between the resilient contact structures and external connection points of the semiconductor package with a contact force which is generally parallel to the top surface of the support substrate.

21 Claims, 9 Drawing Sheets

U.S. PATENT DOCUMENTS

| | | | |
|---|---|---|---|
| 3,842,189 A | | 10/1974 | Southgate |
| 3,982,159 A | | 9/1976 | Dennis et al. |
| 4,074,342 A | | 2/1978 | Honn et al. |
| 4,105,277 A | | 8/1978 | Jacobs |
| 4,138,604 A | * | 2/1979 | Harmsen et al. ............ 439/886 |
| 4,330,163 A | | 5/1982 | Aikens et al. |
| 4,397,086 A | * | 8/1983 | Bickos et al. ............... 439/886 |
| 4,418,857 A | | 12/1983 | Ainslie et al. |
| 4,480,888 A | | 11/1984 | Hopkins et al. |
| 4,553,192 A | | 11/1985 | Babuka et al. |
| 4,667,219 A | | 5/1987 | Lee et al. |
| 4,705,205 A | | 11/1987 | Allen et al. |
| 4,761,140 A | * | 8/1988 | Geib ........................... 439/71 |
| 4,764,848 A | | 8/1988 | Simpson |
| 4,793,814 A | | 12/1988 | Zifcak |
| 4,860,433 A | | 8/1989 | Miura |
| 4,893,172 A | | 1/1990 | Matsumoto et al. |
| 4,906,194 A | | 3/1990 | Grabbe |
| 5,045,975 A | | 9/1991 | Cray et al. |
| 5,067,007 A | | 11/1991 | Kanji et al. |
| 5,098,305 A | | 3/1992 | Krajewski et al. |
| 5,106,309 A | | 4/1992 | Matsuoka et al. |
| 5,109,596 A | | 5/1992 | Driller et al. |
| 5,127,837 A | | 7/1992 | Shah et al. |
| 5,137,461 A | | 8/1992 | Bindra et al. |
| 5,173,055 A | | 12/1992 | Grabbe |
| 5,189,507 A | | 2/1993 | Carlomagno et al. |
| 5,195,237 A | | 3/1993 | Cray et al. |
| 5,228,861 A | | 7/1993 | Grabbe |
| 5,230,632 A | | 7/1993 | Baumberger et al. |
| 5,261,155 A | | 11/1993 | Angulas et al. |
| 5,297,006 A | | 3/1994 | Mizukoshi |
| 5,309,324 A | | 5/1994 | Herandez et al. |
| 5,317,479 A | | 5/1994 | Pai et al. |
| 5,366,380 A | | 11/1994 | Reymond |
| 5,371,654 A | | 12/1994 | Beaman et al. |
| 5,386,341 A | | 1/1995 | Olson et al. |
| 5,399,982 A | | 3/1995 | Driller et al. |
| 5,418,471 A | | 5/1995 | Kardos |
| 5,437,556 A | | 8/1995 | Bargain et al. |
| 5,455,390 A | | 10/1995 | DiStefano et al. |
| 5,462,440 A | | 10/1995 | Rothenberger |
| 5,475,317 A | | 12/1995 | Smith |
| 5,476,211 A | | 12/1995 | Khandros |
| 5,500,605 A | | 3/1996 | Chang |
| 5,531,022 A | | 7/1996 | Beaman et al. |
| 5,561,594 A | | 10/1996 | Wakefield |
| 5,573,435 A | | 11/1996 | Grabbe et al. |
| 5,611,696 A | | 3/1997 | Donner et al. |
| 5,648,893 A | | 7/1997 | Loo et al. |
| 5,669,774 A | | 9/1997 | Grabbe |
| 5,677,566 A | | 10/1997 | King et al. |
| 5,686,842 A | | 11/1997 | Lee |
| 5,713,744 A | | 2/1998 | Laub |
| 5,714,803 A | | 2/1998 | Queyssac |
| 5,810,609 A | | 9/1998 | Faraci et al. |
| 5,917,707 A | | 6/1999 | Khandros et al. |
| 6,029,344 A | | 2/2000 | Khandros et al. |
| 6,110,823 A | | 8/2000 | Eldridge et al. |
| 6,204,455 B1 | | 3/2001 | Gilleo et al. |
| 6,336,269 B1 | | 1/2002 | Eldridge et al. |

FOREIGN PATENT DOCUMENTS

| | | |
|---|---|---|
| JP | 54-146581 | 11/1979 |
| JP | 58178293 | 11/1983 |
| JP | 60-49656 | 3/1985 |
| JP | 61-211977 | 9/1986 |
| JP | 6244285 | 3/1987 |
| JP | 6363777 | 4/1988 |
| JP | 63-187653 | 8/1988 |
| JP | 63243768 | 10/1988 |
| JP | 1-289147 | 11/1989 |
| JP | 2034949 | 2/1990 |
| JP | 2144869 | 6/1990 |
| JP | 5-175376 | 7/1993 |

OTHER PUBLICATIONS

"Interposer for Direct Chip Attach or Surface Mount Array Devices," IBM Technical Disclosure Bulletin, vol. 36, No. 7, p. 137 (Jul. 1993).

"Cooling System for Semiconductor Modules," IBM Technical Disclosure Bulletin, vol. 26, No. 3B, p. 1548 (Aug. 1983).

* cited by examiner

INTERPOSER, SOCKET AND ASSEMBLY FOR SOCKETING AN ELECTRONIC COMPONENT AND METHOD OF MAKING AND USING SAME

CROSS-REFERENCE TO RELATED APPLICATIONS

This is a continuation of U.S. patent application Ser. No. 08/533,584 filed Oct. 18, 1995 (status: issued as U.S. Pat. No. 5,772,451, Jun. 30, 1998) which is a continuation-in-part of commonly-owned, U.S. patent application Ser. No. 08/452,255 (hereinafter "PARENT CASE"), filed Mar. 26, 1995 now U.S. Pat. No. 6,336,269, which is a continuation-in-part of commonly-owned, U.S. patent application Ser. No. 08/340,144 filed Nov. 15, 1994 now U.S. Pat. No. 5,917,707 and its counterpart PCT patent application number PCT/US94/13373 filed Nov. 16, 1994 (published 26 May 95 as WO 95/14314), both of which are continuations-in-part of commonly-owned, U.S. patent application Ser. No. 08/152,812, filed Nov. 16, 1993 issued as U.S. Pat. 5,476,211, Dec. 19, 1995

This is also a continuation-in-part of commonly-owned, U.S. patent application Ser. No. 08/526,246 filed Sep. 21, 1995 now abandoned.

TECHNICAL FIELD OF THE INVENTION

The invention relates to making interconnections between electronic components, especially microelectronic components and, more particularly, to providing techniques for removably mounting (socketing) semiconductor dies and packages to circuit boards.

BACKGROUND OF THE INVENTION

Electronic components, particularly microelectronic components such as semiconductor devices (chips), often have a plurality of terminals (also referred to as bond pads, electrodes, or conductive areas). In order to assemble such devices into a useful system (or subsystem), a number of individual devices must be electrically interconnected with one another, typically through the intermediary of a printed circuit (or wiring) board (PCB, PWB).

Semiconductor devices are typically disposed within a semiconductor package having a plurality of external connection points in the form of pins, pads, leads, solder balls, and the like. Many types of semiconductor packages are known, and techniques for connecting the semiconductor device within the package include bond wires, tape-automated bonding (TAB) and the like. In some cases, a semiconductor device is provided with raised bump contacts, and is connected by flip-chip techniques onto another electronic component.

Generally, interconnections between electronic components can be classified into the two broad categories of "relatively permanent" and "readily demountable".

An example of a "relatively permanent" connection is a solder joint. Once two components are soldered to one another, a process of unsoldering must be used to separate the components. A wire bond is another example of a "relatively permanent" connection.

An example of a "readily demountable" connection is rigid pins of one electronic component being received by resilient socket elements of another electronic component. The socket elements exert a contact force (pressure) on the pins in an amount sufficient to ensure a reliable electrical connection therebetween. Interconnection elements intended to make pressure contact with an electronic component are referred to herein as "springs" or "spring elements".

Spring elements are well known, and appear in a variety of shapes and sizes. In today's microelectronic environment, there is a profound need for all interconnection elements, including springs, to become smaller and smaller, in order that a large plurality of such interconnection elements can be disposed in a small area, to effect a high density of interconnections to electronic components.

Prior art techniques for making spring elements generally involve stamping (punching) or etching a spring material, such as phosphor bronze or beryllium copper or steel or a nickel-iron-cobalt (e.g., kovar) alloy, to form individual spring elements, shaping the spring elements to have a spring shape (e.g., arcuate, etc.), plating the spring elements with a good contact material (e.g., a noble metal such as gold, which will exhibit low contact resistance when contacting a like material) and molding a plurality of such shaped, plated spring elements into a linear, a peripheral or an array pattern. When plating gold onto the aforementioned materials, sometimes a thin (for example, 30–50 microinches), barrier layer of nickel is appropriate.

Various problems and limitations are inherent with such techniques of making spring elements.

For example, these processes are limited when applications demand that a plurality of springs (interconnection elements) be arranged at a fine (e.g., 10 mil) pitch. Such a fine pitch inherently demands that each spring be sized (i.e., in cross-section) substantially smaller (e.g., 3 mil) than the pitch. A punch-out area must be accommodated, and will limit how much material is left over to form springs. At best, even through it may be relatively straightforward to punch out springs as small as 1 mil, such small sizes impose limitations on the contact force that can reliably be exerted by the springs. This is especially poignant in the context of fabricating area arrays of springs.

Generally, a certain minimum contact force is desired to effect reliable pressure contact to electronic components (e.g., to terminals on electronic components). For example, a contact (load) force of approximately 15 grams (including as little as 2 grams or less and as much as 150 grams or more, per contact) may be desired to ensure that a reliable electrical connection is made to a terminal of an electronic component which may be contaminated with films on its surface, or which has corrosion or oxidation products on its surface. The minimum contact force required of each spring demands either that the yield strength of the spring material or that the size of the spring element are increased. As a general proposition, the higher the yield strength of a material, the more difficult it will be to work with (e.g., punch, bend, etc.). And the desire to make springs smaller essentially rules out making them larger in cross-section.

Another limitation attendant prior art interconnection elements is that when hard materials (such as would be used for making springs) are employed, relatively "hostile" (e.g., high temperature) processes such as brazing are required to mount the interconnection elements to terminals of an electronic component. For example, it is known to braze rigid pins to 30 relatively "durable" semiconductor packages. Such "hostile" processes are generally not desirable (and often not feasible) in the context of certain relatively "fragile" electronic components such as semiconductor devices. In contrast thereto, wire bonding is an example of a relatively "friendly" processes which is much less potentially damaging to fragile electronic components than brazing. Soldering is another example of a relatively "friendly" process.

Another problem associated with mounting springs on electronic components is largely mechanical in nature. In cases where a spring is mounted at one end to a substrate (which, for purposes of this proposition is considered to be an immovable object), and is required to react forces applied at its free end, the "weak link" (weakest point, in service) will often be the point at which the spring is attached (e.g., the base of the spring is bonded) to the substrate (e.g., terminal of an electronic component). This accounts, at least in part, for the requirement to employ "hostile" processes (e.g., brazing) to mount the springs to the substrate.

Another subtle problem associated with interconnection elements, including spring contacts, is that, often, the terminals of an electronic component are not perfectly coplanar. Interconnection elements lacking in some mechanism incorporated therewith for accommodating these "tolerances" (gross non-planarities) will be hard pressed to make consistent contact pressure contact with the terminals of the electronic component.

In many modern electronic systems, one or more packaged semiconductor devices are mounted to circuit boards. Various packaging types are well known. Generally, all semiconductor packages have external connections which are either pins, pads, leads, ball bumps, or the like.

One type of semiconductor package is typified by U.S. Pat. No. 4,700,276 ("FREYMAN"), entitled ULTRA HIGH DENSITY PAD ARRAY CHIP CARRIER. As generally disclosed therein, a ceramic substrate is provided with a plurality of through holes plugged with solder on its bottom surface. These solder plugs (206) are arranged in an array pattern, and form external surface mount interconnection points for the final chip carrier arrangement. The solder plugs are generally hemispherical, and permit the substrate to sit high above the board to which the carrier is mounted. A semiconductor package having an array of solder balls as its interconnection points on an external surface thereof is referred to herein as a Ball Grid Array (BGA) type package.

Generally, BGA solder balls are of two types: (1) eutectic masses that melt upon reflow; and (2) masses such as of 90:10 lead:tin that are not melted, but rather are attached with a eutectic material. The first type of solder ball will collapse slightly (e.g., approximately 6 mils) upon reflow, resulting in some concern over the final planarity of the plurality of connections effected thereby. The second type of solder ball does not collapse, since they are not reflowed. However, since a eutectic material is employed to attach the second type of solder balls, certain substrate materials that cannot withstand the heat associated with eutectic attach processes cannot be employed. This information is provided for general background purposes.

Another type of semiconductor package is the Land Grid Array (LGA), which is provided with a plurality (e.g., an array) of terminals (contact pads (or "lands") on a surface thereof. Generally, resilient interconnection elements are used to make electrical connections to the lands of an LGA. The present invention discloses a "socket" having a plurality of resilient interconnection elements for making electrical connections to the terminals of an electronic component such as an LGA-type semiconductor package.

It is generally desired that sockets for LGA and BGA type semiconductor packages be soldered down (e.g., surface-mounted) to a circuit board. Prior art sockets relying on pins require corresponding holes through the circuit board. Using conventional techniques of fabricating holes (e.g., plated through holes) in circuit boards, spacing between adjacent holes (pitch) is typically constrained to no less than 100 mils between adjacent holes. Moreover, plated through holes represent an additional cost in the manufacture of circuit boards. What is needed is a "solder-down" or "surface-mountable" socket to permit connections to be made at a finer pitch (e.g., 50 mils) and at reduced cost.

Additional references of interest, vis-a-vis BGA and LGA type packages include the following U.S. Pat. Nos. 5,241,133; 5,136,366; 5,077,633; 5,006,673; and 4,700,473.

The aforementioned BGA type package is surface-mounted, by soldering the semiconductor package down onto a PCB. This effects a more-or-less permanent connection of the packaged semiconductor device to the PCB. In order to remove the packaged semiconductor device (such as for replacement or upgrading), it would be necessary to unsolder the entire package from the PCB—a process which can damage either the PCB or the semiconductor device contained within the semiconductor package. Moreover, in order to unsolder a component from a PCB, it is generally necessary to remove the PCB from the system in which it is located.

Techniques for demountably connecting semiconductor packages to PCBs do not suffer from such vagaries. For example, a semiconductor package having pins is readily plugged into a socket which is permanently mounted to a PCB, and is just as readily removed from the socket.

One aspect of the present invention is directed to providing a technique whereby any electronic component such as a BGA or an LGA type semiconductor package can readily be demounted, without unsoldering, from a PCB—in other words, providing "sockets" for BGA and LGA type semiconductor packages. This facilitates not only the replacement/upgrading of the packaged semiconductor device, but also provides the opportunity to test the packaged semiconductor device in instances where the PCB is a probe card, or a probe card insert.

As a general proposition, demountable connections require some sort of pressure contact to be made between electronic components. Sockets for receiving pinned semiconductor packages typically have leaf-type spring elements for receiving the package pins.

The following U.S. Pat. Nos. are cited as being of interest: 5,386,344; 5,336,380; 5,317,479; 5,086,337; 5,067,007; 4,989,069; 4,893,172; 4,793,814; 4,777,564; 4,764,848; 4,667,219; 4,642,889; 4,330,165; 4,295,700; 4,067,104; 3,795,037; 3,616,532; and 3,509,270.

Another aspect of the present invention is directed to techniques for forming solder balls and/or raised solder bumps on electronic components, particularly on chip carriers or semiconductor packages. In the main hereinafter, techniques for forming solder "balls" are discussed.

Techniques for forming solder balls and/or raised solder bumps on electronic components include, by way of example only:

(1) applying dollops (small quantities) of solder paste to contact pads and reflowing the solder paste;
(2) solder-plugging plated areas (see, e.g., FIG. 2c of FREYMAN);
(3) molding solder ball contacts directly on a substrate (see, e.g., U.S. Pat. No. 5,381,848); and
(4) filling holes in a film carrier with solder, placing the carrier over the substrate, and reflowing the solder to adhere to contact pads on the substrate (see, e.g., U.S. Pat. No. 5,388,327).

Other methods of forming raised solder contacts, of some relevance to the present invention, are the techniques disclosed in the aforementioned commonly-owned, copending U.S. patent applications Ser. Nos. 08/152,812, 08/340,144 and 08/452,255, which generally involve bonding a wire at two (both) ends to a terminal of an electronic component and overcoating the wire with solder. (See, e.g., FIGS. 24A and 24B of Ser. No. 08/452,255; FIG. 16 of Ser. No. 08/340,144; and FIGS. 2–5 of Ser. No. 08/152,812.)

BRIEF DESCRIPTION (SUMMARY) OF THE INVENTION

It is a general object of the present invention to provide a technique for fabricating interconnection elements for electronic components.

It is another object of the invention to provide interconnection elements that attach easily to electronic components.

It is another object of the invention to provide interconnection elements that are suitable for making pressure contact to electronic components.

It is another object of the invention to provide a technique for demountably interconnecting (socketing) a BGA-type semiconductor package to an electronic component, such as a PCB.

It is another object of the invention to provide a technique for demountably interconnecting (socketing) an LGA-type semiconductor package to an electronic component, such as a PCB.

It is another object of the invention to provide a technique for forming solder balls and/or raised solder bumps on electronic components, particularly on chip carriers or semiconductor packages.

According to the invention, techniques are disclosed for fabricating interconnection elements, particularly spring elements, and for mounting the interconnection elements to electronic components. The disclosed techniques overcome problems associated with making spring elements of extremely small size, yet capable of exerting contact forces of sufficient magnitude to ensure reliable interconnections. The disclosed techniques also overcome problems associated with mounting springs on electronic components, such as semiconductor devices.

According to the invention, a "composite" (multilayer) interconnection element is fabricated by mounting an elongate element ("core") to an electronic component, shaping the core to have a spring shape, and overcoating the core to enhance the physical (e.g., spring) characteristics of the resulting composite interconnection element and/or to securely anchor the resulting composite interconnection element to the electronic component.

The use of the term "composite", throughout the description set forth herein, is consistent with a 'generic' meaning of the term (e.g., formed of two or more elements), and is not to be confused with any usage of the term "composite" in other fields of endeavor, for example, as it may be applied to materials such as glass, carbon or other fibers supported in a matrix of resin or the like.

As used herein, the term "spring shape" refers to virtually any shape of an elongate element which will exhibit elastic (restorative) movement of an end (tip) of the elongate element with respect to a force applied to the tip. This includes elongate elements shaped to have one or more bends, as well as substantially straight elongate elements.

As used herein, the terms "contact area", "terminal", "pad", and the like refer to any conductive area on any electronic component to which an interconnection element is mounted or makes contact.

As used herein, the term "solder ball" refers to any mass of solder, or the like, providing a solderable, raised contact structure on a surface of an electronic component such as a semiconductor package or a support substrate. Such solder balls are employed to make permanent electrical connections between the electronic component to which they are mounted and terminals of another electronic component.

Alternatively, the core is shaped prior to mounting to an electronic component.

Alternatively, the core is mounted to or is a part of a sacrificial substrate which is not an electronic component. The sacrificial substrate is removed after shaping, and either before or after overcoating. According to an aspect of the invention, tips having various topographies can be disposed at the contact ends of the interconnection elements. (See also FIGS. 11A–11F of the aforementioned PARENT CASE.)

In an embodiment of the invention, the core is a "soft" material having a relatively low yield strength, and is overcoated with a "hard" material having a relatively high yield strength. For example, a soft material such as a gold wire is attached (e.g., by wire bonding) to a bond pad of a semiconductor device and is overcoated (e.g., by electrochemical plating) with a hard material such nickel and its alloys.

Vis-a-vis overcoating the core, single and multi-layer overcoatings, "rough" overcoatings having microprotrusions (see also FIGS. 5C and 5D of the PARENT CASE), and overcoatings extending the entire length of or only a portion of the length of the core, are described. In the latter case, the tip of the core may suitably be exposed for making contact to an electronic component (see also FIG. 5B of the PARENT CASE).

Generally, throughout the description set forth herein, the term "plating" is used as exemplary of a number of techniques for overcoating the core. It is within the scope of this invention that the core can be overcoated by any suitable technique including, but not limited to: various processes involving deposition of materials out of aqueous solutions; electrolytic plating; electroless plating; chemical vapor deposition (CVD); physical vapor deposition (PVD); processes causing the deposition of materials through induced disintegration of liquid or solid precursors; and the like, all of these techniques for depositing materials being generally well known.

Generally, for overcoating the core with a metallic material such as nickel, electrochemical processes are preferred, especially electroless plating.

In another embodiment of the invention, the core is an elongate element of a "hard" material, inherently suitable to functioning as a spring element, and is mounted at one end to a terminal of an electronic component. The core, and at least an adjacent area of the terminal, is overcoated with a material which will enhance anchoring the core to the terminal. In this manner, it is not necessary that the core be well-mounted to the terminal prior to overcoating, and processes which are less potentially damaging to the electronic component may be employed to "tack" the core in place for subsequent overcoating. These "friendly" processes include soldering, gluing, and piercing an end of the hard core into a soft portion of the terminal.

Embodiments wherein the core is a wire are disclosed. Embodiments wherein the core is a flat tab (conductive metallic ribbon) are also disclosed.

Representative materials, both for the core and for the overcoatings, are disclosed.

In the main hereinafter, techniques involving beginning with a relatively soft (low yield strength) core, which is generally of very small dimension (e.g., 3.0 mil or less) are described. Soft materials, such as gold, which attach easily to semiconductor devices, generally lack sufficient resiliency to function as springs. (Such soft, metallic materials exhibit primarily plastic, rather than elastic deformation.) Other soft materials which may attach easily to semiconductor devices and possess appropriate resiliency are often electrically non-conductive, as in the case of most elastomeric materials. In either case, desired structural and electrical characteristics can be imparted to the resulting composite interconnection element by the overcoating applied over the core. The resulting composite interconnection element can be made very small, yet can exhibit appropriate contact forces. Moreover, a plurality of such composite interconnection elements can be arranged at a fine pitch (e.g., 10 mils), even though they have a length (e.g., 100 mils) which is much greater than the distance to a neighboring composite interconnection element (the distance between neighboring interconnection elements being termed "pitch").

It is within the scope of this invention that composite interconnection elements can be fabricated on a microminiature scale, for example as "microsprings" for connectors and sockets, having cross-sectional dimensions on the order of twenty-five microns ($\mu$m), or less. This ability to manufacture reliable interconnection having dimensions measured in microns, rather than mils, squarely addresses the evolving needs of existing interconnection technology and future area array technology.

The composite interconnection elements of the present invention exhibit superior electrical characteristics, including electrical conductivity, solderability and low contact resistance. In many cases, deflection of the interconnection element in response to applied contact forces results in a "wiping" contact, which helps ensure that a reliable contact is made.

An additional advantage of the present invention is that connections made with the interconnection elements of the present invention are readily demountable. Soldering, to effect the interconnection to a terminal of an electronic component is optional, but is generally not preferred at a system level.

According to an aspect of the invention, techniques are described for making interconnection elements having controlled impedance. These techniques generally involve coating (e.g., electrophoretically) a conductive core or an entire composite interconnection element with a dielectric material (insulating layer), and overcoating the dielectric material with an outer layer of a conductive material. By grounding the outer conductive material layer, the resulting interconnection element can effectively be shielded, and its impedance can readily be controlled. (See also FIG. 10K of the PARENT CASE.)

According to an aspect of the invention, interconnection elements can be pre-fabricated as individual units, for later attachment to electronic components. Various techniques for accomplishing this objective are set forth herein. Although not specifically covered in this document, it is deemed to be relatively straightforward to fabricate a machine that will handle the mounting of a plurality of individual interconnection elements to a substrate or, alternatively, suspending a plurality of individual interconnection elements in an elastomer, or on a support substrate.

It should clearly be understood that the composite interconnection element of the present invention differs dramatically from interconnection elements of the prior art which have been coated to enhance their electrical conductivity characteristics or to enhance their resistance to corrosion.

The overcoating of the present invention is specifically intended to substantially enhance anchoring of the interconnection element to a terminal of an electronic component and/or to impart desired resilient characteristics to the resulting composite interconnection element. Stresses (contact forces) are directed to portions of the interconnection elements which are specifically intended to absorb the stresses.

It should also be appreciated that the present invention provides essentially a new technique for making spring structures. Generally, the operative structure of the resulting spring is a product of plating, rather than of bending and shaping. This opens the door to using a wide variety of materials to establish the spring shape, and a variety of "friendly" processes for attaching the "falsework" of the core to electronic components. The overcoating functions as a "superstructure" over the "falsework" of the core, both of which terms have their origins in the field of civil engineering.

According to one aspect of the present invention, "sockets" are provided for permitting LGA and BGA type semiconductor packages to be removably connected (socketed) to an electronic component such as a circuit board (e.g., PCB, PWB). Generally, the sockets include a support substrate having a top surface and a bottom surface. Solder balls, or the like, are provided on the bottom surface of the support substrate for soldering the socket to a circuit board, thereby effecting a permanent (albeit demountable) connection between the socket and a circuit board (hence,the term "solder-down", as used herein). A plurality of resilient contact structures are provided on the top surface of the support substrate (or in any suitable manner permitting the resilient contact structures to extend upward from the top surface of the support substrate) for making pressure connections to the external connection points (pads, balls) of an LGA-type or of a BGA-type package, respectively.

Generally, throughout the socket embodiments disclosed herein, any resilient contact structure may be used. The composite interconnection elements of the present invention are simply an example of suitable resilient contact structures for such sockets, and are generally preferred due to their aforementioned relative ease of manufacture with small dimensions.

In an embodiment of the invention serving as a socket for LGA-type packages, the pressure contact is made to tips of the resilient contact structures in a direction which is generally normal to the top surface of the support substrate.

In an embodiment of the invention serving as a socket for BGA-type packages, the pressure contact is made to tips of the resilient contact structures in a direction which is generally parallel to the top surface of the support substrate.

Generally, the embodiments of solder-down sockets described herein provide an effective technique for making pressure connections to terminals of any electronic component, including semiconductor packages and bare unpackaged semiconductor dies. The solder-down socket includes a support substrate having a top surface and a bottom surface, a plurality of resilient contact structures extending from the top surface of the support substrate, each resilient contact structure having a tip at a free end thereof; and means for effecting a pressure connection between the tips of the resilient contact structures and the terminals of the electronic component. Generally, either one or the other of the electronic component or the tips of the resilient contact structures must be moved, relative to the other, to effect such pressure connections. For example, the means for effecting the pressure connection may be a movable sliding element to which the electronic component is mounted, suitable for moving the terminals of the electronic component against the tips of the resilient contact structures. Alternatively, the means for effecting the pressure connection may be a movable sliding element acting upon the resilient contact structures, suitable for moving the tips of the resilient contact structures against the terminals of the electronic component. In either case, it is desirable to effect a wiping movement of the tips of the resilient contact structures against the terminals of the electronic component. Preferably, irrespective of whether it is the tips of the resilient contact structures or the terminals themselves that are moved, a mechanism is provided for limiting how far the tips of the resilient contact structures wide across the terminals of the electronic component, to ensure that they remain in pressure contact with the terminals of the electronic component. As noted, it is preferred that the socket be permanently mounted to a circuit board. To this end, it is preferred that a plurality of solderable raised contact structure are disposed on the bottom surface of the support substrate and connected via the support substrate to the plurality of resilient contact structures.

It should be understood that the LGA-type sockets disclosed herein are suitable for making pressure connections to bare dies having bond pads disposed on a surface thereof, and that the BGA type sockets disclosed herein are suitable for making pressure connections to bare dies having raised contact structures disposed on a surface thereof. An example of raised contact structures on a surface of a semiconductor die are raised solder contacts (bumps) fabricated by IBM's "C4" process. As used herein, a "bare die" is a semiconductor chip (device) that has not been packaged, whether the chip is aggregated with other chips on a semiconductor wafer or after individual chips have been singulated from a semiconductor wafer.

Additionally, a novel technique is disclosed for mounting solder balls on pads (contact areas, terminals) of an electronic component. For example, this technique can be employed to mount the aforementioned solder balls on the aforementioned support substrates for LGA and BGA solder-down sockets.

Generally, the solder preform includes a plurality of large solder masses connected to one another by a plurality of smaller solder bridges. The solder preform is disposed against a surface of an electronic component whereupon it is desired to mount solder balls, and the solder preform is heated so as to reflow the solder masses and solder bridges. During reflow, the solder masses become solder balls, and the solder bridges are subsumed into the solder balls. Preferably, soldering flux or solder paste is provided on either the solder preform or on the pads of the electronic component prior to reflow heating.

Other objects, features and advantages of the invention will become apparent in light of the following description thereof.

BRIEF DESCRIPTION OF THE DRAWINGS

Reference will be made in detail to preferred embodiments of the invention, examples of which are illustrated in the accompanying drawings. Although the invention will be described in the context of these preferred embodiments, it should be understood that it is not intended to limit the spirit and scope of the invention to these particular embodiments.

DETAILED DESCRIPTION OF THE INVENTION

The disclosure of the aforementioned U.S. patent application Ser. No. 08/452,255, filed May 26, 1995 ("PARENT CASE") is incorporated by reference herein. This patent application summarizes several of the techniques disclosed therein.

An important aspect of the present invention is that a "composite" interconnection element can be formed by starting with a core (which may be mounted to a terminal of an electronic component), then overcoating the core with an appropriate material to: (1) establish the mechanical properties of the resulting composite interconnection element; and/or (2) when the interconnection element is mounted to a terminal of an electronic component, securely anchor the interconnection element to the terminal. In this manner, a resilient interconnection element (spring element) can be fabricated, starting with a core of a soft material which is readily shaped into a springable shape and which is readily attached to even the most fragile of electronic components.

In light of prior art techniques of forming spring elements from hard materials, is not readily apparent, and is arguably counter-intuitive, that soft materials can form the basis of spring elements. Such a "composite" interconnection element is generally the preferred form of resilient contact structure for use in the embodiments of the present invention.

FIGS. 1A, 1B, 1C and 1D illustrate, in a general manner, various shapes for composite interconnection elements, according to the present invention.

In the main, hereinafter, composite interconnection elements which exhibit resiliency are described. However, it should be understood that non-resilient composite interconnection elements fall within the scope of the invention.

Further, in the main hereinafter, composite interconnection elements that have a soft (readily shaped, and amenable to affixing by friendly processes to electronic components) core, overcoated by hard (springy) materials are described. It is, however, within the scope of the invention that the core can be a hard material—the overcoat serving primarily to securely anchor the interconnection element to a terminal of an electronic component.

Figure 1A:
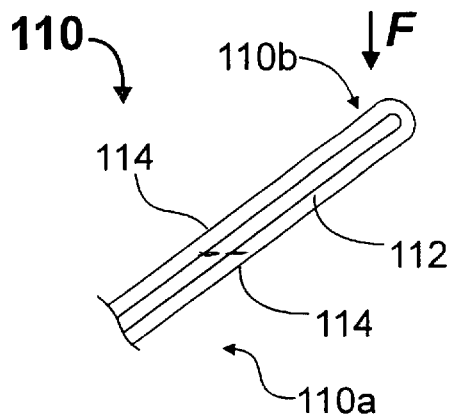
FIG. 1A is a cross-sectional view of a longitudinal portion, including one end, of an interconnection element, according to an embodiment of the invention.

In FIG. 1A, an electrical interconnection element 110 includes a core 112 of a "soft" material (e.g., a material having a yield strength of less than 40,000 psi), and a shell (overcoat) 114 of a "hard" material (e.g., a material having a yield strength of greater than 80,000 psi). The core 112 is an elongate element shaped (configured) as a substantially straight cantilever beam, and may be a wire having a diameter of 0.0005–0.0030 inches (0.001 inch=1 mil≈25 microns ($\mu$m)). The shell 114 is applied over the already-shaped core 112 by any suitable process, such as by a suitable plating process (e.g., by electrochemical plating).

FIG. 1A illustrates what is perhaps the simplest of spring shapes for an interconnection element of the present invention—namely, a straight cantilever beam oriented at an angle to a force "F" applied at its tip 110b. When such a force is applied by a terminal of an electronic component to which the interconnection element is making a pressure contact, the downward (as viewed) deflection of the tip will evidently result in the tip moving across the terminal, in a "wiping" motion. Such a wiping contact ensures a reliable contact being made between the interconnection element and the contacted terminal of the electronic component.

By virtue of its "hardness", and by controlling its thickness (0.00025–0.00500 inches), the shell 114 imparts a desired resiliency to the overall interconnection element 110. In this manner, a resilient interconnection between electronic components (not shown) can be effected between the two ends 110a and 100b of the interconnection element 110. (In FIG. 1A, the reference numeral 100a indicates an end portion of the interconnection element 110, and the actual end opposite the end 110b is not shown.) In contacting a terminal of an electronic component, the interconnection element 110 would be subjected to a contact force (pressure), as indicated by the arrow labelled "F".

The interconnection element (e.g., 110) will deflect in response to an applied contact force, said deflection (resiliency) being determined in part by the overall shape of the interconnection element, in part by the dominant (greater) yield strength of the overcoating material (versus that of the core), and in part by the thickness of the overcoating material.

As used herein, the terms "cantilever" and "cantilever beam" are used to indicate that an elongate structure (e.g., the overcoated core 112) is mounted (fixed) at one end, and the other end is free to move, typically in response to a force acting generally transverse to the longitudinal axis of the elongate element. No other specific or limiting meaning is intended to be conveyed or connoted by the use of these terms.

Figure 1B:
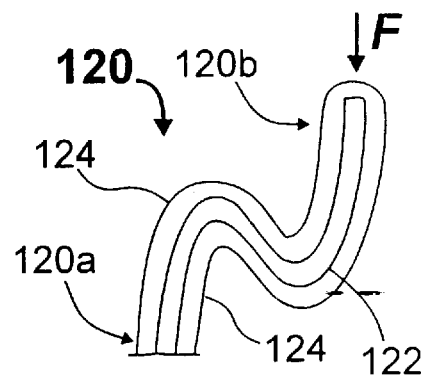
FIG. 1B is a cross-sectional view of a longitudinal portion, including one end, of an interconnection element, according to another embodiment of the invention.

In FIG. 1B, an electrical interconnection element 120 similarly includes a soft core 122 (compare 112) and a hard shell 124 (compare 114). In this example, the core 122 is shaped to have two bends, and thus may be considered to be S-shaped. As in the example of FIG. 1A, in this manner, a resilient interconnection between electronic components (not shown) can be effected between the two ends 120*a* and 120*b* of the interconnection element 120. (In FIG. 1B, reference numeral 120*a* indicates an end portion of the interconnection element 120, and the actual end opposite the end 120*b* is not shown.) In contacting a terminal of an electronic component, the interconnection element 120 would be subjected to a contact force (pressure), as indicated by the arrow labelled "F".

Figure 1C:
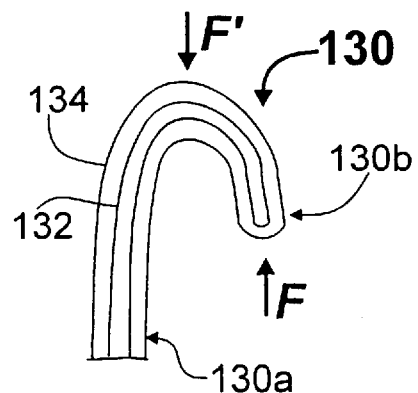
FIG. 1C is a cross-sectional view of a longitudinal portion, including one end of an interconnection element, according to another embodiment of the invention.

In FIG. 1C, an electrical interconnection element 130 similarly includes a soft core 132 (compare 112) and a hard shell 134 (compare 114). In this example, the core 132 is shaped to have one bend, and may be considered to be U-shaped. As in the example of FIG. 1A, in this manner, a resilient interconnection between electronic components (not shown) can be effected between the two ends 130*a* and 130*b* of the interconnection element 130. (In FIG. 1C, the reference numeral 130*a* indicates an end portion of the interconnection element 130, and the actual end opposite the end 130*b* is not shown.) In contacting a terminal of an electronic component, the interconnection element 130 could be subjected to a contact force (pressure), as indicated by the arrow labelled "F". Alternatively, the interconnection element 130 could be employed to make contact at other than its end 130*b*, as indicated by the arrow labelled "F'".

Figure 1D:
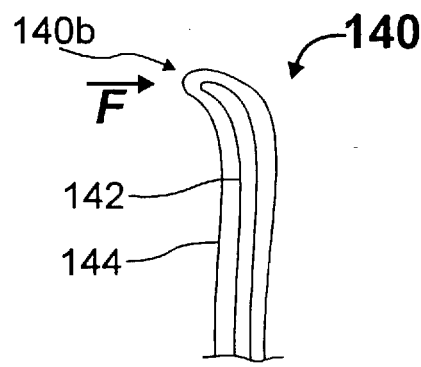
FIG. 1D is a cross-sectional view of a longitudinal portion, including one end of an interconnection element, according to another embodiment of the invention.

FIG. 1D illustrates another embodiment of a resilient interconnection element 140 having a soft core 142 and a hard shell 144. In this example, the interconnection element 140 is essentially a simple cantilever (compare FIG. 1A), with a curved tip 140*b*, subject to a contact force "F" acting transverse to its longitudinal axis.

Figure 1E:
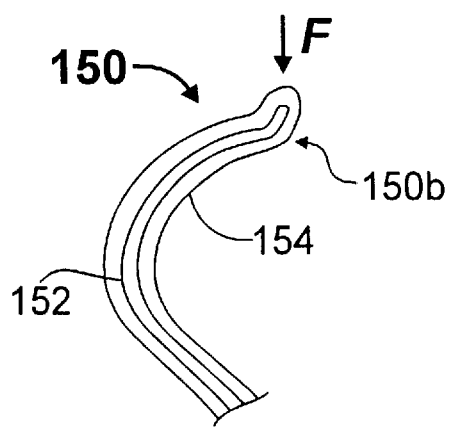
FIG. 1E is a cross-sectional view of a longitudinal portion, including one end of an interconnection element, according to another embodiment of the invention.

FIG. 1E illustrates another embodiment of a resilient interconnection element 150 having a soft core 152 and a hard shell 154. In this example, the interconnection element 150 is generally "C-shaped", preferably with a slightly curved tip 150*b*, and is suitable for making a pressure contact as indicated by the arrow labelled "F".

It should be understood that the soft core can readily be formed into any springable shape—in other words, a shape that will cause a resulting interconnection element to deflect resiliently in response to a force applied at its tip. For example, the core could be formed into a conventional coil shape. However, a coil shape would not be preferred, due to the overall length of the interconnection element and inductances (and the like) associated therewith and the adverse effect of same on circuitry operating at high frequencies (speeds).

The material of the shell, or at least one layer of a multi-layer shell (described hereinbelow) has a significantly higher yield strength than the material of the core. Therefore, the shell overshadows the core in establishing the mechanical characteristics (e.g., resiliency) of the resulting interconnection structure. Ratios of shell:core yield strengths are preferably at least 2:1, including at least 3:1 and at least 5:1, and may be as high as 10:1. It is also evident that the shell, or at least an outer layer of a multi-layer shell should be electrically conductive, notably in cases where the shell covers the end of the core. (The parent case, however, describes embodiments where the end of the core is exposed, in which case the core must be conductive.)

From an academic viewpoint, it is only necessary that the springing (spring shaped) portion of the resulting composite interconnection element be overcoated with the hard material. From this viewpoint, it is generally not essential that both of the two ends of the core be overcoated. As a practical matter, however, it is preferred to overcoat the entire core. Particular reasons for and advantages accruing to overcoating an end of the core which is anchored (attached) to an electronic component are discussed in greater detail hereinbelow.

Suitable materials for the core (112, 122, 132, 142) include, but are not limited to: gold, aluminum, copper, and their alloys. These materials are typically alloyed with small amounts of other metals to obtain desired physical properties, such as with beryllium, cadmium, silicon, magnesium, and the like. It is also possible to use silver, palladium, platinum; metals or alloys such as metals of the platinum group of elements. Solder constituted from lead, tin, indium, bismuth, cadmium, antimony and their alloys can be used.

Vis-a-vis attaching an end of the core (wire) to a terminal of an electronic component (discussed in greater detail hereinbelow), generally, a wire of any material (e.g., gold) that is amenable to bonding (using temperature, pressure and/or ultrasonic energy to effect the bonding) would be suitable for practicing the invention. It is within the scope of this invention that any material amenable to overcoating (e.g., plating), including non-metallic material, can be used for the core.

Suitable materials for the shell (114, 124, 134, 144) include (and, as is discussed hereinbelow, for the individual layers of a multi-layer shell), but are not limited to: nickel, and its alloys; copper, cobalt, iron, and their alloys; gold (especially hard gold) and silver, both of which exhibit excellent current-carrying capabilities and good contact resistivity characteristics; elements of the platinum group; noble metals; semi-noble metals and their alloys, particularly elements of the platinum group and their alloys; tungsten and molybdenum. In cases where a solder-like finish is desired, tin, lead, bismuth, indium and their alloys can also be used.

The technique selected for applying these coating materials over the various core materials set forth hereinabove will, of course, vary from application-to-application. Electroplating and electroless plating are generally preferred techniques. Generally, however, it would be counter-intuitive to plate over a gold core. According to an aspect of the invention, when plating (especially electroless plating) a nickel shell over a gold core, it is desirable to first apply a thin copper initiation layer over the gold wire stem, in order to facilitate plating initiation.

An exemplary interconnection element, such as is illustrated in FIGS. 1A–1E may have a core diameter of approximately 0.001 inches and a shell thickness of 0.001 inches —the interconnection element thus having an overall diameter of approximately 0.003 inches (i.e., core diameter plus two times the shell thickness). Generally, this thickness of the shell will be on the order of 0.2–5.0 (one-fifth to five) times the thickness (e.g., diameter) of the core.

Some exemplary parameters for composite interconnection elements are:

(a) A gold wire core having a diameter of 1.5 mils is shaped to have an overall height of 40 mils and a generally C-shape curve (compare FIG. 1E) of 9 mils radius, is plated with 0.75 mils of nickel (overall diameter=1.5+2×0.75=3 mils), and optionally receives a final overcoat of 50 microinches of gold (e.g., to lower and enhance contact resistance). The resulting composite interconnection element exhibits a spring constant (k) of approximately 3–5 grams/mil. In use, 3–5 mils of deflection will result in a contact force of 9–25 grams. This example is useful in the context of a spring element for an interposer.

(b) A gold wire core having a diameter of 1.0 mils is shaped to have an overall height of 35 mils, is plated with 1.25 mils of nickel (overall diameter=1.0+2× 1.25=3.5 mils), and optionally receives a final overcoat of 50 microinches of gold. The resulting composite interconnection element exhibits a spring constant (k) of approximately 3 grams/mil, and is useful in the context of a spring element for a probe.

(c) A gold wire core having a diameter of 1.5 mils is shaped to have an overall height of 20 mils and a generally S-shape curve with radii of approximately 5 mils, is plated with 0.75 mils of nickel or copper (overall diameter =1.5+2×0.75=3 mils). The resulting composite interconnection element exhibits a spring constant (k) of approximately 2–3 grams/mil, and is useful in the context of a spring element for mounting on a semiconductor device.

As will be illustrated in greater detail hereinbelow, the core need not have a round cross-section, but may rather be a flat tab (having a rectangular cross-section) extending from a sheet. It should be understood that, as used herein, the term "tab" is not to be confused with the term "TAB" (Tape Automated Bonding).

Multi-layer Shells

Figure 2A:
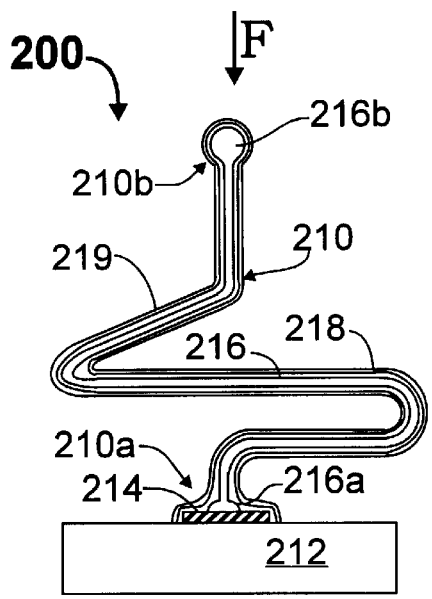
FIG. 2A is a cross-sectional view of an interconnection element mounted to a terminal of an electronic component and having a multi-layered shell, according to the invention.

FIG. 2A illustrates an embodiment 200 of an interconnection element 210 mounted to an electronic component 212 which is provided with a terminal 214. In this example, a soft (e.g., gold) wire core 216 is bonded (attached) at one end 216a to the terminal 214, is configured to extend from the terminal and have a spring shape (compare the shape shown in FIG. 1B), and is severed to have a free end 216b. Bonding, shaping and severing a wire in this manner is accomplished using wirebonding equipment. The bond at the end 216a of the core covers only a relatively small portion of the exposed surface of the terminal 214.

A shell is disposed over the wire core 216 which, in this example, is shown as being multi-layered, having an inner layer 218 and an outer layer 219, both of which layers may suitably be applied by plating processes. One or more layers of the multi-layer shell is (are) formed of a hard material (such as nickel and its alloys) to impart a desired resiliency to the interconnection element 210. For example, the outer layer 219 may be of a hard material, and the inner layer may be of a material that acts as a buffer or barrier layer (or as an activation layer, or as an adhesion layer) in plating the hard material 219 onto the core material 216. Alternatively, the inner layer 218 may be the hard material, and the outer layer 219 may be a material (such as soft gold) that exhibits superior electrical characteristics, including electrical conductivity and solderability. When a solder or braze type contact is desired, the outer layer of the interconnection element may be lead-tin solder or gold-tin braze material, respectively.

Anchoring to a Terminal

FIG. 2A illustrates, in a general manner, another key feature of the invention—namely, that resilient interconnection element can be securely anchored to a terminal on an electronic component. The attached end 210a of the interconnection element will be subject to significant mechanical stress, as a result of a compressive force (arrow "F") applied to the free end 210b of the interconnection element.

As illustrated in FIG. 2A, the overcoat (218, 219) covers not only the core 216, but also the entire remaining (i.e., other than the bond 216a) exposed surface of the terminal 214 adjacent the core 216 in a continuous (non-interrupted) manner. This securely and reliably anchors the interconnection element 210 to the terminal, the overcoat material providing a substantial (e.g., greater than 50%) contribution to anchoring the resulting interconnection element to the terminal. Generally, it is only required that the overcoat material cover at least a portion of the terminal adjacent the core. It is generally preferred, however, that the overcoat material cover the entire remaining surface of the terminal. Preferably, each layer of the shell is metallic.

As a general proposition, the relatively small area at which the core is attached (e.g., bonded) to the terminal is not well suited to accommodating stresses resulting from contact forces ("F") imposed on the resulting composite interconnection element. By virtue of the shell covering the entire exposed surface of the terminal (other than in the relatively small area comprising the attachment of the core end 216a to the terminal), the overall interconnection structure is firmly anchored to the terminal. The adhesion strength, and ability to react contact forces, of the overcoat will far exceed that of the core end (216a) itself.

As used herein, the term "electronic component" (e.g., 212) includes, but is not limited to: interconnect and interposer substrates; semiconductor wafers and dies, made of any suitable semiconducting material such as silicon (Si) or gallium-arsenide (GaAs); production interconnect sockets; test sockets; sacrificial members, elements and substrates, as described in the parent case; semiconductor packages, including ceramic and plastic packages, and chip carriers; and connectors.

The interconnection element of the present invention is particularly well suited for use as:

interconnection elements mounted directly to silicon dies, eliminating the need for having a semiconductor package;

interconnection elements extending as probes from substrates (described in greater detail hereinbelow) for testing electronic components; and interconnection elements of interposers (discussed in greater detail hereinbelow).

The interconnection element of the present invention is unique in that it benefits from the mechanical characteristics (e.g., high yield strength) of a hard material without being limited by the attendant typically poor bonding characteristic of hard materials. As elaborated upon in the parent case, this is made possible largely by the fact that the shell (overcoat) functions as a "superstructure" over the "falsework" of the core, two terms which are borrowed from the milieu of civil engineering. This is very different from plated interconnection elements of the prior art wherein the plating is used as a protective (e.g., anti-corrosive) coating, and is generally incapable of imparting the desired mechanical characteristic to the interconnection structure. And this is certainly in marked contrast to any non-metallic, anticorrosive coatings, such as benzotriazole (BTA) applied to electrical interconnects.

Among the numerous advantages of the present invention are that a plurality of free-standing interconnect structures are readily formed on substrates, from different levels thereof such as a PCB having a decoupling capacitor) to a common height above the substrate, so that their free ends are coplanar with one another. Additionally, both the electrical and mechanical (e.g., plastic and elastic) characteristics of an interconnection element formed according to the invention are readily tailored for particular applications. For example, it may be desirable in a given application that the interconnection elements exhibit both plastic and elastic deformation. (Plastic deformation may be desired to accommodate gross non-planarities in components being interconnected by the interconnection elements.) When elastic behavior is desired, it is necessary that the interconnection element generate a threshold minimum amount of contact force to effect a reliable contact. It is also advantageous that the tip of the interconnection element makes a wiping contact with a terminal of an electronic component, due to the occasional presence of contaminant films on the contacting surfaces.

As used herein, the term "resilient", as applied to contact structures, implies contact structures (interconnection elements) that exhibit primarily elastic behavior in response to an applied load (contact force), and the term "compliant" implies contact structures (interconnection elements) that exhibit both elastic and plastic behavior in response to an applied load (contact force). As used herein, a "compliant" contact structure is a "resilient" contact structure. The composite interconnection elements of the present invention are a special case of either compliant or resilient contact structures.

A number of features are elaborated upon in detail, in the parent case, including, but not limited to: fabricating the interconnection elements on sacrificial substrates; gang-transferring a plurality of interconnection elements to an electronic component; providing the interconnection elements with contact tips, preferably with a rough surface finish; employing the interconnection elements on an electronic component to make temporary, then permanent connections to the electronic component; arranging the interconnection elements to have different spacing at their one ends than at their opposite ends; fabricating spring clips and alignment pins in the same process steps as fabricating the interconnection elements; employing the interconnection elements to accommodate differences in thermal expansion between connected components; eliminating the need for discrete semiconductor packages (such as for SIMMs); and optionally soldering resilient interconnection elements (resilient contact structures).

Controlled Impedance

Figure 2B:
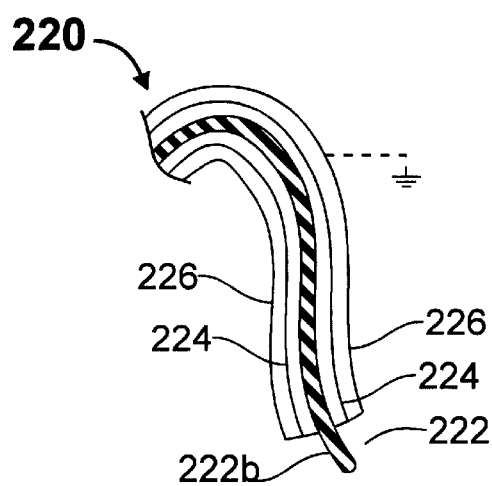
FIG. 2B is a cross-sectional view of an interconnection element having a multi-layered shell, wherein an intermediate layer is of a dielectric material, according to the invention.

FIG. 2B shows a composite interconnection element 220 having multiple layers. An innermost portion (inner elongate conductive element) 222 of the interconnection element 220 is either an uncoated core or a core which has been overcoated, as described hereinabove. The tip 222b of the innermost portion 222 is masked with a suitable masking material (not shown). A dielectric layer 224 is applied over the innermost portion 222 such as by an electrophoretic process. An outer layer 226 of a conductive material is applied over the dielectric layer 224.

In use, electrically grounding the outer layer 226 will result in the interconnection element 220 having controlled impedance. An exemplary material for the dielectric layer 224 is a polymeric material, applied in any suitable manner and to any suitable thickness (e.g., 0.1–3.0 mils).

The outer layer 226 may be multi-layer. For example, in instances wherein the innermost portion 222 is an uncoated core, at least one layer of the outer layer 226 is a spring material, when it is desired that the overall interconnection element exhibit resilience.

Probe Card Insert

Figure 2C:
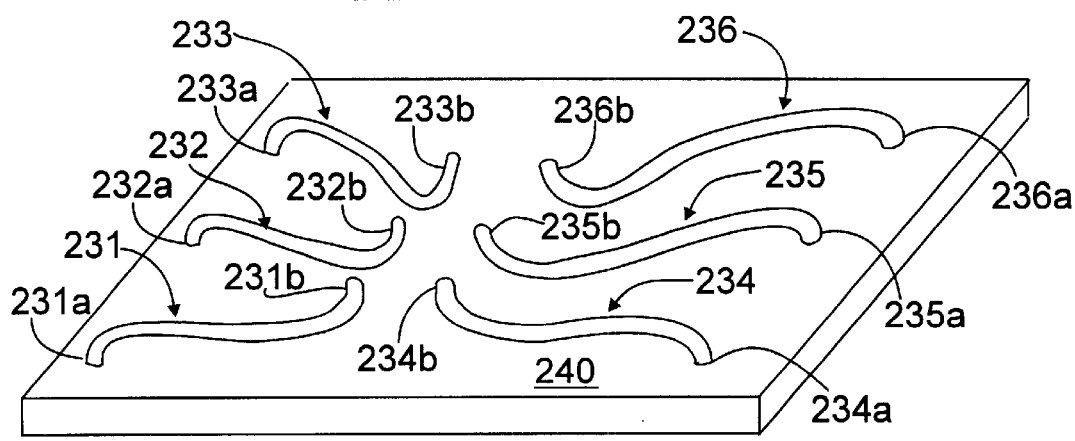
FIG. 2C is a perspective view of a plurality of interconnection elements mounted to an electronic component (e.g., a probe card insert), according to the invention.

FIG. 2C illustrates an embodiment 250 wherein a plurality (six of many shown) of interconnection elements 251 . . . 256 are mounted on a surface of an electronic component 260, such as a probe card insert (a subassembly mounted in a conventional manner to a probe card). Terminals and conductive traces of the probe card insert are omitted from this view, for illustrative clarity. The attached ends 251a . . . 256a of the interconnection elements 251 . . . 256 originate at a first pitch (spacing), such as a 0.010 inches. The interconnection elements 251 . . . 256 are shaped and/or oriented so that their free ends (tips) are at a second, finer pitch, such as 0.005 inches. An interconnect assembly which makes interconnections from a one pitch to another pitch is typically referred to as a "space transformer".

As illustrated, the tips 251b . . . 256b of the interconnection elements are arranged in two parallel rows, such as for making contact to (for testing and/or burning in) a semiconductor device having two parallel rows of bond pads (contact points). The interconnection elements can be arranged to have other tip patterns, for making contact to electronic components having other contact point patterns, such as arrays.

Generally, throughout the embodiments disclosed herein, although only one interconnection element may be shown, the invention is applicable to fabricating a plurality of interconnection components and arranging the plurality of interconnection elements in a prescribed spatial relationship with one another, such as in a peripheral pattern or in a rectangular array pattern.

Use of Sacrificial Substrates

The mounting of interconnection elements directly to terminals of electronic components has been discussed hereinabove. Generally speaking, the interconnection elements of the present invention can be fabricated upon, or mounted to, any suitable surface of any suitable substrate, including sacrificial substrates.

Attention is directed to the PARENT CASE, which describes, for example with respect to FIGS. 11A–11F fabricating a plurality of interconnection structures (e.g., resilient contact structures) as separate and distinct structures for subsequent mounting to electronic components, and which describes with respect to FIGS. 12A–12C mounting a plurality of interconnection elements to a sacrificial substrate (carrier) then transferring the plurality of interconnection elements en masse to an electronic component.

Figure 2D:
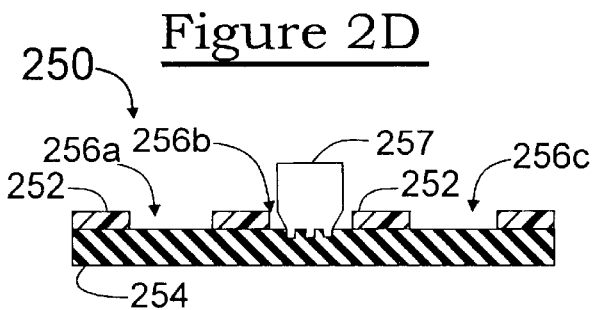
FIG. 2D is a cross-sectional view of an exemplary first step of a technique for manufacturing interconnection elements, according to the invention.
Figure 2E:
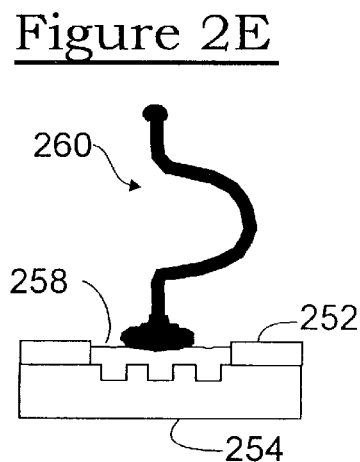
FIG. 2E is a cross-sectional view of an exemplary further step of the technique of FIG. 2D for manufacturing interconnection elements, according to the invention.
Figure 2F:
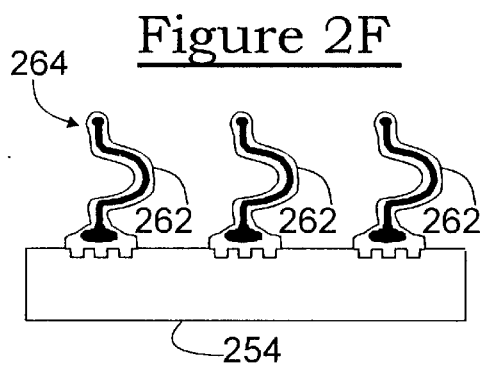
FIG. 2F is a cross-sectional view of an exemplary further step of the technique of FIG. 2E for manufacturing interconnection elements, according to the invention.

FIGS. 2D–2F illustrate a technique for fabricating a plurality of interconnection elements having preformed tip structures, using a sacrificial substrate.

FIG. 2D illustrates a first step of the technique 250, in which a patterned layer of masking material 252 is applied onto a surface of a sacrificial substrate 254. The sacrificial substrate 254 may be of thin (1–10 mil) copper or aluminum foil, by way of example, and the masking material 252 may be common photoresist. The masking layer 252 is patterned to have a plurality (three of many shown) of openings at locations 256a, 256b, 256c whereat it is desired to fabricate interconnection elements. The locations 256a, 256b and 256c are, in this sense, comparable to the terminals of an electronic component. The locations 256a, 256b and 256c are preferably treated at this stage to have a rough or featured surface texture. As shown, this may be accomplished mechanically with an embossing tool 257 forming depressions in the foil 254 at the locations 256a, 256b and 256c. Alternatively, the surface of the foil at these locations can be chemically etched to have a surface texture. Any technique suitable for effecting this general purpose is within the scope of this invention, for example sand blasting, peening and the like.

Next, a plurality (one of many shown) of conductive tip structures 258 are formed at each location (e.g., 256b), as illustrated by FIG. 2E. This may be accomplished using any suitable technique, such as electroplating, and may include tip structures having multiple layers of material. For example, the tip structure 258 may have a thin (e.g., 10–100 microinch) barrier layer of nickel applied onto the sacrificial substrate, followed by a thin (e.g., 10 microinch) layer of soft gold, followed by a thin (e.g., 20 microinch) layer of hard gold, followed by a relatively thick (e.g., 200 microinch) layer of nickel, followed by a final thin (e.g., 100 microinch) layer of soft gold. Generally, the first thin barrier layer of nickel is provided to protect the subsequent layer of gold from being "poisoned" by the material (e.g., aluminum, copper) of the substrate 254, the relatively thick layer of nickel is to provide strength to the tip structure, and the final thin layer of soft gold provides a surface which is readily bonded to. The invention is not limited to any particulars of how the tip structures are formed on the sacrificial substrate, as these particulars would inevitably vary from application-to-application.

As illustrated by FIG. 2E, a plurality (one of many shown) of cores 260 for interconnection elements may be formed on the tip structures 258, such as by any of the techniques of bonding a soft wire core to a terminal of an electronic component described hereinabove. The cores 260 are then overcoated with a preferably hard material 262 in the manner described hereinabove, and the masking material 252 is then removed, resulting in a plurality (three of many shown) of free-standing interconnection elements 264 mounted to a surface of the sacrificial substrate, as illustrated by FIG. 2F.

In a manner analogous to the overcoat material covering at least the adjacent area of a terminal (214) described with respect to FIG. 2A, the overcoat material 262 firmly anchors the cores 260 to their respective tip structures 258 and, if desired, imparts resilient characteristics to the resulting interconnection elements 264. As noted in the PARENT CASE, the plurality of interconnection elements mounted to the sacrificial substrate may be gang-transferred to terminals of an electronic component. Alternatively, two widely divergent paths may be taken.

Figure 2G:
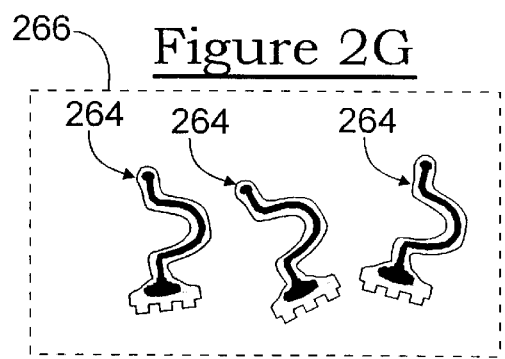
FIG. 2G is a cross-sectional view of an exemplary plurality of individual interconnection elements fabricated according to the technique of FIGS. 2D–2F, according to the invention.

As illustrated by FIG. 2G, the sacrificial substrate 254 may simply be removed, by any suitable process such as selective chemical etching. Since most selective chemical etching processes will etch one material at a much greater rate than an other material, and the other material may slightly be etched in the process, this phenomenon is advantageously employed to remove the thin barrier layer of nickel in the tip structure contemporaneously with removing the sacrificial substrate. However, if need be, the thin nickel barrier layer can be removed in a subsequent etch step. This results in a plurality (three of many shown) of individual, discrete, singulated interconnection elements 264, as indicated by the dashed line 266, which may later be mounted (such as by soldering or brazing) to terminals on electronic components.

It bears mention that the overcoat material may also be slightly thinned in the process of removing the sacrificial substrate and/or the thin barrier layer. However, it is preferred that this not occur.

To prevent thinning of the overcoat, it is preferred that a thin layer of gold or, for example, approximately 10 microinches of soft gold applied over approximately 20 microinches of hard gold, be applied as a final layer over the overcoat material 262. Such an outer layer of gold is intended primarily for its superior conductivity, contact resistance, and solderability, and is generally highly impervious to most etching solutions contemplated to be used to remove the thin barrier layer and the sacrificial substrate.

Figure 2H:
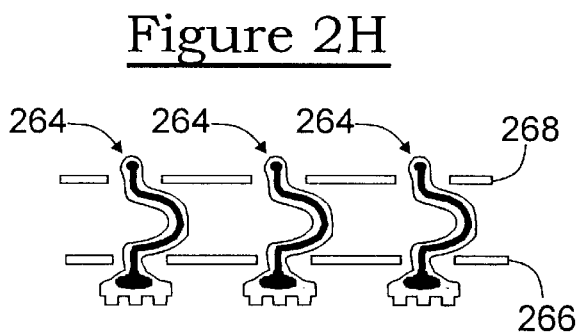
FIG. 2H is a cross-sectional view of an exemplary plurality of interconnection elements fabricated according to the technique of FIGS. 2D–2F, and associated in a prescribed spatial relationship with one another, according to the invention.

Alternatively, as illustrated by FIG. 2H, prior to removing the sacrificial substrate 254, the plurality (three of many shown) of interconnection elements 264 may be "fixed" in a desired spatial relationship with one another by any suitable support structure 266, such as by a thin plate having a plurality of holes therein, whereupon the sacrificial substrate is removed. The support structure 266 may be of a dielectric material, or of a conductive material overcoated with a dielectric material. Further processing steps (not illustrated) such as mounting the plurality of interconnection elements to an electronic component such as a silicon wafer or a printed circuit board may then proceed. Additionally, in some applications, it may be desireable to stabilize the tips (opposite the tip structures) of the interconnection elements 264 from moving, especially when contact forces are applied thereto. To this end, it may also be desirable to constrain movement of the tips of the interconnection elements with a suitable sheet 268 having a plurality of holes, such as a mesh formed of a dielectric material.

A distinct advantage of the technique 250 described hereinabove is that tip structures (258) may be formed of virtually any desired material and having virtually any desired texture. As mentioned hereinabove, gold is an example of a noble metal that exhibits excellent electrical characteristics of electrical conductivity, low contact resistance, solderability, and resistance to corrosion. Since gold is also malleable, it is extremely well-suited to be a final overcoat applied over any of the interconnection elements described herein, particularly the resilient interconnection elements described herein. Other noble metals exhibit similar desirable characteristics. However, certain materials such as rhodium which exhibit such excellent electrical characteristics would generally be inappropriate for overcoating an entire interconnection element. Rhodium, for example, is notably brittle, and would not perform well as a final overcoat on a resilient interconnection element. In this regard, techniques exemplified by the technique 250 readily overcome this limitation. For example, the first layer of a multi-layer tip structure (see 258) can be rhodium (rather than gold, as described hereinabove), thereby exploiting its superior electrical characteristics for making contact to electronic components without having any impact whatsoever on the mechanical behavior of the resulting interconnection element.

Figure 2I:
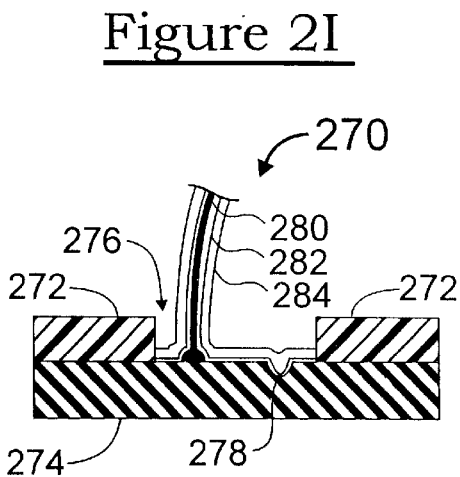
FIG. 2I is a cross-sectional view of an alternate embodiment for manufacturing interconnection elements, showing a one end portion of one interconnection element, according to the invention.

FIG. 2I illustrates an alternate embodiment 270 for fabricating interconnection elements. In this embodiment, a masking material 272 is applied to the surface of a sacrificial substrate 274, and is patterned to have a plurality (one of many shown) of openings 276, in a manner similar to the technique described hereinabove with respect to FIG. 2D. The openings 276 define areas whereat interconnection elements will be fabricated as free-standing structures. (As used throughout the descriptions set forth herein, an interconnection element is "free-standing" when is has a one end bonded to a terminal of an electronic component or to an area of a sacrificial substrate, and the opposite end of the interconnection element is not bonded to the electronic component or sacrificial substrate.)

The area within the opening may be textured, in any suitable manner, such as to have one or more depressions, as indicated by the single depression 278 extending into the surface of the sacrificial substrate 274.

A core (wire stem) 280 is bonded to the surface of the sacrificial substrate within the opening 276, and may have any suitable shape. In this illustration, only a one end of one interconnection element is shown, for illustrative clarity. The other end (not shown) may be attached to an electronic component. It may now readily be observed that the technique 270 differs from the aforementioned technique 250 in that the core 280 is bonded directly to the sacrificial substrate 274, rather than to a tip structure 258. By way of example, a gold wire core (280) is readily bonded, using conventional wirebonding techniques, to the surface of an aluminum substrate (274).

In a next step of the process (270), a layer 282 of gold is applied (e.g., by plating) over the core 280 and onto the exposed area of the substrate 274 within the opening 276, including within the depression 278. The primary purpose of this layer 282 is to form a contact surface at the end of the resulting interconnection element (i.e., once the sacrificial substrate is removed).

Next, a layer 284 of a relatively hard material, such as nickel, is applied over the layer 282. As mentioned hereinabove, one primary purpose of this layer 284 is to impart desired mechanical characteristics (e.g., resiliency) to the resulting composite interconnection element. In this embodiment, another primary purpose of the layer 284 is to enhance the durability of the contact surface being fabricated at the lower (as viewed) end of the resulting interconnection element. A final layer of gold (not shown) may be applied over the layer 284, to enhance the electrical characteristics of the resulting interconnection element.

In a final step, the masking material 272 and sacrificial substrate 274 are removed, resulting in either a plurality of singulated interconnection elements (compare FIG. 2G) or in a plurality of interconnection elements having a predetermined spatial relationship with one another (compare FIG. 2H).

This embodiment 270 is exemplary of a technique for fabricating textured contact tips on the ends of interconnection elements. In this case, an excellent example of a "gold over nickel" contact tip has been described. It is, however, within the scope of the invention that other analogous contact tips could be fabricated at the ends of interconnection elements, according to the techniques described herein. Another feature of this embodiment 270 is that the contact tips are constructed entirely atop the sacrificial substrate (274), rather than within the surface of the sacrificial substrate (254) as contemplated by the previous embodiment 250.

Forming Interconnection Elements from Sheets

The discussion set forth hereinabove has, in the main, generally focused on forming composite interconnection elements from wire cores which shaped and overcoated, soft wire cores and hard overcoatings being exemplary.

The present invention is also applicable to forming interconnection elements which are formed of metal sheets, preferably soft metal sheets, which are patterned (such as by stamping or etching) to form flat elongate elements (tabs) which are shaped and overcoated, preferably with a hard material.

An advantage of this and, as will be evident, subsequently-described techniques, is that a soft, non-resilient metal sheet, which is easily formed (punched and shaped) can be overcoated to exhibit desired resilient characteristics, in a manner similar to previously described soft wire cores being shaped and overcoated with a hard material to exhibit resiliency.

It is within the scope of this invention that a plurality of flat tab interconnection elements can be formed as individual contact structures, subsequently to be supported in proximity to one another, such as with a support sheet.

LGA Socket

Land grid array (LGA) semiconductor packages have been discussed hereinabove, and are advantageous in many applications and, in the context of the present invention, are exemplary of any electronic component having an array of terminals (pads, contact areas) on a surface thereof for which it is desired that the electronic component be readily mounted to and readily demounted from another electronic component such as a circuit board.

Figure 3:
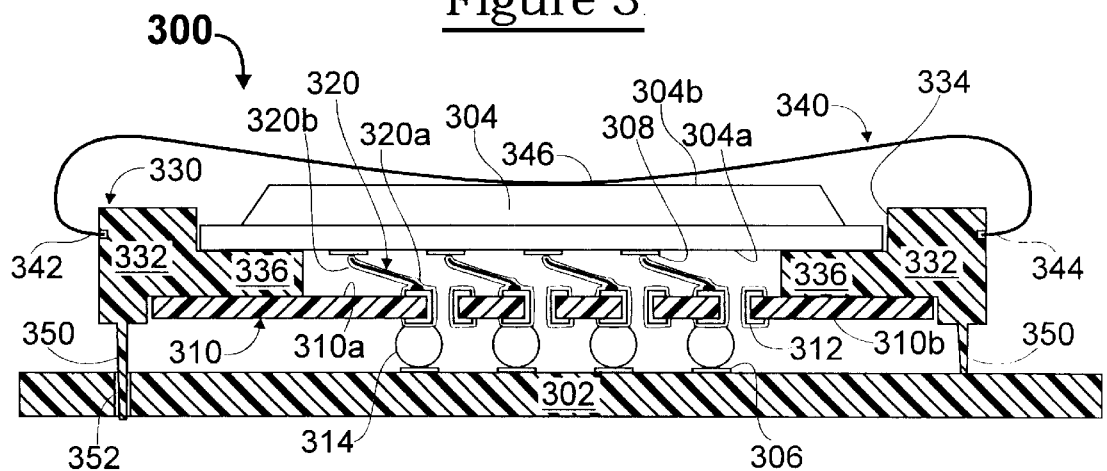
FIG. 3 is a cross-sectional view of an embodiment of an LGA socket, according to the invention.

FIG. 3 illustrates an embodiment of a solder-down (surface mount) LGA socket 300 for mounting to a printed circuit board (PCB) substrate 302 and for making pressure contacts to the pads of an LGA package 304. As used herein, the term "sockets" refers to an electronic component having interconnection elements, suitable for making electrical connections to terminals or connection points of another electronic component. The sockets of the present invention are primarily intended to permit a semiconductor package to be removably connected to a circuit board.

The PCB 302 has a plurality (four of many shown) of terminals 306 on its top (as viewed) surface, and the LGA package 304 has a plurality (four of many shown) of terminals (external connection points) 308 disposed on its bottom surface 304*a*. The socket 300 effects a plurality of connections between respective contact areas (terminals, pads) of the circuit board 302 and the LGA package 304 in the following manner.

The socket 300 includes a support substrate 310 formed, for example, of conventional PCB material, and is provided with a plurality (four of many shown) of plated through holes 312, in a conventional manner. Each through hole 312 has portions residing on the top surface 310*a* and bottom surface 310*b* of the support substrate 310. A plurality (four of many shown) of solderable raised contact structures 314 (such as conventional solder balls) are disposed on the bottom surface 310*b* of the support substrate 310, on bottom-surface portions of the plated through holes 312. Many techniques, such as those techniques described hereinabove, for mounting these solder balls 314 to the bottom surface of the insulating substrate, are suitable. Another suitable technique for mounting solder balls to an electronic component is described hereinbelow, with respect to FIGS. 7A–7C.

The solder balls of this and subsequently-described embodiments serve as "contact structures" disposed on the bottom surface of the support substrate. It is not contemplated that these contact structures exhibit any significant resiliency, and it is contemplated that these contact structures are preferably solder balls.

A plurality (four of many shown) of free-standing resilient contact structures 320 are mounted to the top surface 310*a* of the support substrate 310 by bonding a core to the top-surface portions of the plated through holes 312, and overcoating the cores with a hard material, as described in greater detail hereinabove. These resilient contact structures 320 may extend, for example, approximately 20–100 mils from the top surface 310*a* of the support substrate 310, and are suitably the composite interconnection elements of the present invention.

It is within the scope of this invention that the solder-down sockets disclosed herein can have resilient contact structures which are other than the composite interconnection elements disclosed herein mounted to the top surface of the support substrate. In the main, hereinafter, the resilient contact structures mounted atop the support substrate are referred to simply as "interconnection elements".

Each of the interconnection elements 320 is anchored to the support substrate 310 at its base (proximal end) 320a, and has a tip (distal end) 320b. These tips 320b are preferably coplanar with one another. For a given LGA semiconductor package 304, having pads 308 disposed in a given pattern and at a given pitch, the interconnection elements are formed such that the tips 320b are disposed in a pattern and at a pitch corresponding to that of the pads 308.

The socket 300 thus has a plurality of free-standing interconnection structures 320 extending from the top surface 310a of the support substrate 310, and a plurality of solder balls 314 disposed on the bottom surface 310b of the support substrate 310. As explained hereinbelow, this permits an LGA package, or similar electronic component, to be demountably connected to a PCB board.

In use, the socket 300 is soldered down onto the PCB 302, by reflowing the solder balls 314, and an LGA package 304 is disposed onto the socket 300 so that its pads 308 contact the tips 320b of the interconnection elements 320, making a pressure connection therewith. In order to maintain alignment between the pads 308 and the tips 320b, a frame element 330 is provided around the socket 300.

When the LGA package (or other electronic component, including a semiconductor die) is urged down (vertically downward, as viewed) onto the resilient contact structures (in a direction which is generally normal to the top surface of the support substrate 310), the tips 320b of the resilient contact structures will deflect primarily in the vertical (as viewed) direction to effect a pressure connection between the tips 320b and the terminals (308). However, there will also be a component of tip deflection in the horizontal (as viewed) direction (generally parallel to the top surface of the support substrate 310), causing the tips 320b to wipe across the terminals 308. This wiping action, albeit limited, is desirable for ensuring that a reliable pressure connection between the tips 320b and the terminals 308.

The frame element 330 is formed of any suitable, preferably insulating material, such as thermoplastic, is generally ring-shaped (annular), and is sized to fit around the periphery of the support substrate 310. The frame element 330 has a body portion 332, and an inner surface 334. The inner surface 334 of the frame element 330 is provided with a stepped portion (region of decreased diameter) 336.

The top surface 310a of the support substrate 310 is suitably disposed against a lower (as viewed) surface of the stepped portion 336, and may be affixed thereto with a suitable adhesive (not shown). In this manner, the frame element 330 will retain the support substrate 310. A small (e.g., 2 mil or less) gap between the peripheral edge of the support substrate 310 and the body 332 of the frame element 330 is permissible.

The bottom surface 304a of the LGA package 304 is suitably disposed against an upper (as viewed) surface of the stepped portion 336. In this manner, the frame element 330 will establish a position for the LGA package 304 relative to the support substrate 310. A small (e.g., 1–2 mil) gap between the peripheral edge of the LGA package 304 and the body 332 of the frame element 330 is generally desirable.

It should be understood that, for rectangular or square electronic components (e.g., semiconductor packages 304, support substrates 310), the frame element will be in the form of a rectangular or square ring, rather than a round (circular) ring, in which case the term "diameter", as used hereinabove, is considered simply to be a transverse dimension of the frame element.

In the socket 300 of this embodiment of the invention, the interconnection elements 320 are resilient and it is necessary that the LGA package 304 cause the interconnection elements 320 to deflect for making pressure contact to the pads 308 of the LGA package 304. This requires that the vertical (as viewed) extent of the stepped portion 336 be advertently less than the un-deflected height of the interconnection elements. Put another way, the top (as viewed) surface of the stepped portion 336 is closer, by a distance "x", to the top surface 310a of the support substrate 310 than the tips 320b of the interconnection elements 320. This distance "x" will depend upon the amount of deflection desired of the interconnection elements 320, deflections of 10–20 mils being "nominal" for effecting pressure connections to microelectronic components. As a general proposition, for making an effective pressure connection to a microelectronic component, contact forces of approximately 5–20 grams are desirable. This contact force will be a result of the spring constant of the interconnection element (320) and the amount of deflection imposed upon the interconnection element (320).

Evidently, it is important to provide means for holding (urging, mechanically biasing) the LGA package 304 down (as viewed) against the interconnection elements 320. To this end, any suitable mechanism can be employed, such as a spring clip 340 which extends entirely across the body 332 of the frame element 330.

The exemplary spring clip 340 has two ends 342 and 344. Each end 342 and 344 may be clipped into a corresponding recess (shown, not labelled) on an external surface of the frame element 330, as shown. The exemplary spring clip 340 is bowed, so that a midportion 346 thereof provides a downward (as shown) force upon the top surface 304b of the LGA package 304. The downward "travel" of the LGA package is limited by the top surface of the stepped portion 336 of the frame element 330.

It is within the scope of this invention that the ends (342 and 344) of the spring clip (340) can be inserted into holes (not shown) extending through the circuit board (302) to hold the electronic component (304) in place.

It is also within the scope of this invention that the spring clip (340), or any analogous hold-down mechanism, can act upon a heat sink (not shown) associated with the electronic component (304), or can be incorporated as a component of a heat sink disposed upon the electronic component (304).

It is within the scope of this invention that means other than the exemplary spring clip 340 can be used to mechanically bias the LGA package 304 against the tips of the interconnection elements 320.

In use, the socket 300 is soldered down onto the PCB 302, and an electronic component (e.g., LGA package 304) is clipped into the frame element 330 to urge the external connection points (308) of the semiconductor package (304) against the tips (320b) of the resilient contact structures (320), in a direction which is generally normal (i.e., at ninety degrees) to the top surface (310a) of the support substrate (310). In this manner, removable connections are made between the plurality of external connection points (308) and the resilient contact structures (320). To replace the LGA package 304 is a simple matter of removing the clip (340), replacing the LGA package, and replacing the clip.

Evidently, as electronic component 304 is urged downward (as viewed) onto the interconnection elements 320, the tips 320b of the interconnection elements 320 will deflect both in the downward direction (vertically, as viewed in the figure) and, to a lesser extent, in a lateral direction (horizontally, as viewed in the figure). The horizontal movement of the tips 320b causes the tips 320b to "wipe" across the terminals 308 of the electronic component 304, further ensuring that a reliable pressure connection is effected between the tips 320b of the interconnection elements 320 and the terminals 308 of the electronic component 304.

In FIG. 3, the solder balls 314 are shown as not having been reflowed in the soldering-down process, for illustrative clarity. Additionally, solder "fillets" smoothing the interface between the solder balls 314 and the contact areas 312 are omitted from the figure, for illustrative clarity.

It is within the scope of this invention that the bases 320a of the interconnection elements 320 are arranged in a pattern and at a pitch which is dissimilar from the pattern and pitch of the tips 320b. Techniques for accomplishing such an objective, and the potential desirability of same, and are illustrated in FIG. 2C hereinabove, and are also shown in the aforementioned PCT Patent Application No. PCT/US94/13373 (see, e.g., FIG. 23 therein).

It is also within the scope of this invention that the solder balls 314 on the bottom surface of the support substrate 310 be arranged in a pattern and at a pitch which dissimilar from the pattern and pitch of the bases 320a. Techniques for accomplishing such an objective are well known, for example, by rerouting connections through the use of multilayer circuit boards.

It is within the scope of this invention that the hard material overcoating the core of the composite interconnection elements (320) is dendritic, or. the like, exhibiting microprotrusions, as discussed in the aforementioned U.S. patent application Ser. No. 08/452,255.

FIG. 3 also illustrates an exemplary mechanism for locating (aligning) the frame element 330, hence the support substrate 310, vis-a-vis the circuit board 302. To this end, a bottom surface of the frame element 330 is provided with locating pins 350, which may be integrally formed therewith, and the PCB 310 is provided with corresponding holes 352. The pins 350 have a diameter which is only slightly (e.g., 0.003") less than the diameter of the holes 352, and may be tapered. In this manner, the pins 350 will readily insert into the holes 352, and the frame element 330 may be affixed to the PCB 302, if desired, with a dollop of any suitable adhesive. The pins 350 and holes 352 are an optional feature. They can be reversed or omitted, and any other suitable means for locating the frame member (330) vis-a-vis the PCB (302) may be employed, including alignment pins extending from (or to) the support substrate itself. Loose-pin alignment is readily achieved by sizing the holes 352 to be 2–5 mils larger (in diameter) than the pins 350.

It is within the scope of this invention that the pins 350 either are formed integrally with the body portion 332 of the frame element 330, or are formed as separate and distinct elements which are attached by any suitable technique (e.g., insertion into holes, adhesives, thermosonic welding, etc.) to the body portion 332 of the frame element 330.

It is preferred that solder balls (314) are utilized as the mechanism for making electrical connections between the socket (300) and the contact areas (306) of the circuit board (302), rather than alternate methods of effecting the electrical connections (for example, pins, pads, leads). Solder balls (314) will, when reflowed, tend to self-align to the corresponding contact areas (306) on the circuit board (302), and will also serve to securely, permanently mount the socket to the circuit board in a "conventional" manner that is readily dealt with be component assemblers.

It is within the scope of this invention that the mechanism for aligning the socket to the circuit board could be other than the pin 350 and hole 352, and that additional functionality of securing the socket to the circuit board be achieved with such an aligning mechanism. For example, screws (not shown) passing through the holes (352) into (or through) the socket body (332) would secure the socket to the circuit board (302).

Figure 3A:
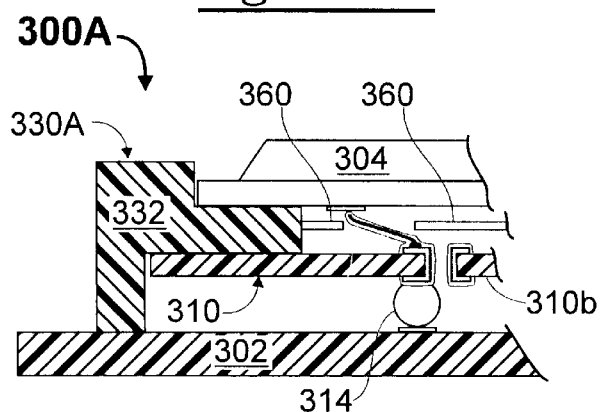
FIG. 3A is a cross-sectional view of another embodiment of an LGA socket, according to the invention.

FIG. 3A illustrates an alternate embodiment 300A of the socket 300 of the present invention. As in the previous embodiment, the frame element 330A is provided with a body portion 332 that extends sufficiently below the bottom surface 310b of the support substrate 310, for example approximately 15 mils, so as to establish a predefined height (vertical, as viewed) for the solder joints resulting from reflow of the solder balls 314.

FIG. 3A also illustrates an optional stiffener element 360 (compare 268). The stiffener element 360 is simply a flat, planar element having a plurality of openings through which the interconnection elements (320) extend, and is disposed near the tips (320b) of the interconnection elements (320). The stiffener element 360 is formed of an insulating material, and may be formed integrally with the frame element 330A. Alternatively, the stiffener element 360 is a discrete element, such as meshed screening or perforated sheet, of any suitable material such as polyethylene, polypropylene, fiber glass, neoprene, nylon, saran, or the like. The stiffener element 360 may have more openings than the number of interconnection elements, and will not noticeably adversely impact the resilient nature of the interconnection elements. Generally, the openings should be large enough for the interconnection elements to extend therethrough. The stiffener element 360 may also be a metallic material covered by an insulating (dielectric) material.

A principal purpose of the stiffener element 360 is to prevent mechanical damage to the interconnection elements (320) during handling (accidental contact with the tips). Additionally, the stiffener element 360 and the holes therethrough are sized, shaped and disposed so as limit the extent of wiping (horizontal, as viewed) movement of the tips of the interconnection elements when the interconnection elements are making pressure contact to the terminals of an electronic component.

Wiping, when making a pressure connection is most assuredly desirable. Nevertheless, it is desirable in most applications to limit the wiping movement of the tip of the resilient interconnection element to ensure that the tip does not wipe itself entirely off of the terminal of the electronic component to which it is making a pressure connection. Consider, for example, a composite interconnection element formed according to the techniques of the present invention having a diameter (cross-sectional dimension) of 4 mils making a pressure connection to a terminal of an electronic component having a cross-dimension (diameter, if round) of 30 mils. Evidently, it is preferred to target initial contact of the tip of the resilient interconnection element at the center of the terminal (this can be pictured as a 4 mil diameter circle concentrically disposed within a 30 mil diameter circle). Targeting the tips of the resilient interconnection elements at the center of the terminals is preferred when dealing with a large plurality of such resilient interconnection elements and such terminals, to allow for manufacturing tolerances. If the tip of the resilient interconnection element is permitted to wipe 13 mils from its initial contact position, and assuming that initial contact was made precisely at the center of the terminal, it will commence to wipe itself right off the terminal. Another 4 mils of wiping movement, and the tip will be entirely off the terminal, completely eliminating any possibility of an effective pressure contact being made therebetween. Hence, the desirability of limiting wiping motion of the resilient interconnection elements, and an important feature of the stiffener element 360. Preferably, pressure connections as contemplated herein are made to terminals of electronic components having a cross-dimension (diameter, if round) of at least 10 mils. It should be understood that limiting wiping is not limited to any one embodiment disclosed herein.

It is explicitly within the scope of this invention that an arrangement of resilient interconnection elements such as has been shown and described with respect to FIG. 3 can be used to make a plurality of pressure connections to any electronic component, including but not limited to bare (unpackaged) semiconductor dies.

Figure 3B:
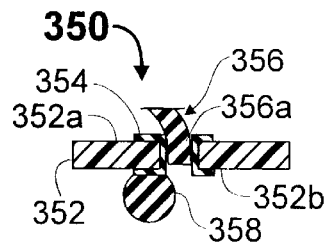
FIG. 3B is a cross-sectional view of another embodiment of a socket, showing a one end portion of one interconnection element, according to the present invention.

FIG. 3B illustrates another embodiment of a socket 350 applicable to removably receiving an electronic component in the manner of the embodiment 300 or of the embodiment 400 (described hereinbelow). Whereas, in the main herein, the sockets which are described have a resilient contact structure (e.g., 320) mounted to the top surface of a support substrate (e.g., 310), in this embodiment 350 end portions of the resilient contact structure extend into the support substrate.

As illustrated in FIG. 3B, a support substrate 352 (compare 310) is provided with a plurality (one of many shown) of plated through holes 354 (compare 312). The support substrate 352 has a top surface 352*a* (compare 310*a*) and a bottom surface 352*b* (compare 310*b*). The support substrate 352 is suitably a conventional printed wiring board (PCB, circuit board). As is known, the through holes 354 have conductive areas which are exposed on the top surface 352*a* of the support substrate 352, and conductive areas which are exposed on the bottom surface 352*b* of the support substrate 352.

In this exemplary embodiment 350, a resilient contact structure 356 having two ends is inserted with an interference fit into each of the plated through holes 354. In other words, the bottom end 356*a* (compare 320*a*) of the resilient contact structure 356 is sized to fit snugly within the bore of the through hole 354. Only the lower (bottom) end portion of the resilient contact structure 356 is illustrated in the figure, as its spring shape and tip orientation will ultimately be dependent upon whether it is intended that the resilient contact structure make pressure contact with pad terminals (compare 308, above) of an electronic component or with solder ball terminals (compare 408, below) of an electronic component.

A plurality (one of many shown) of solder balls 358 are disposed on the conductive areas of the through holes 354 which are exposed on the lower surface of the support substrate 352. In this manner, a socket assembly is provided, consistent with the many embodiments disclosed both hereinabove and hereinbelow, which has resilient contact structures extending from its top surface to make pressure connections to terminals of an electronic component (e.g., LGA semiconductor package, BGA semiconductor package, bare semiconductor die, etc.) and non-resilient, solderable contact structures disposed on its bottom surface to make permanent connections to another electronic component such as a mother board. This "hybrid" arrangement of resilient contact structures atop a substrate and non-resilient contact structures beneath a substrate is analogous to the construction illustrated in FIG. 7 of the aforementioned PCT/US94/13373, which describes situations where compliance is only required on one side of an interconnection component.

Figure 3C:
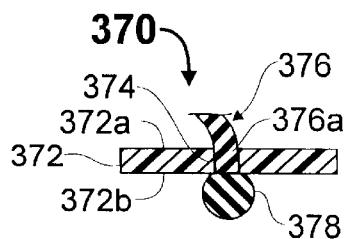
FIG. 3C is a cross-sectional view of another embodiment of a socket, showing a one end portion of one interconnection element, according to the present invention.

FIG. 3C illustrates another embodiment of a socket 370, similar to the previously-described embodiment 350 in that end portions of the resilient contact structure extend into the support substrate, rather than being mounted atop same. Although not mounted to the top surface of the substrate, in these embodiments 350 and 370, the resilient contact structures similarly extend from the top surface of the support substrate.

In this embodiment 370, a support substrate 372 (compare 352) is provided with a plurality (one of many shown) of through holes 374 (compare 354) which are not plated. The support substrate 372 has a top surface 372*a* (compare 352*a*) and a bottom surface 372*b* (compare 352*b*). The support substrate 372 is suitably formed from a conventional printed wiring board (PCB, circuit board), or as a plastic (e.g., molded) part.

In this exemplary embodiment 370, a resilient contact structure 376 having two ends is inserted with an interference fit into each of the through holes 374. In other words, the bottom end 376*a* (compare 356*a*) of the resilient contact structure 376 is sized to fit snugly within the bore of the through hole 374. Only the lower (bottom) end portion of the resilient contact structure 376 is illustrated in the figure, as its spring shape and tip orientation will ultimately be dependent upon whether it is intended that the resilient contact structure make pressure contact with pad terminals (compare 308, above) of an electronic component or with solder ball terminals (compare 408, below) of an electronic component.

A plurality (one of many shown) of solder balls 378 are disposed on the bottom surface 372*b* of the support substrate 372 at the location of each through hole 374, so as to be "directly" (i.e., without the intermediary of a plated through hole or wiring layers within the support substrate) electrically connected to the bottom (as viewed) ends of the resilient contact structures 376 extending through the through holes 374.

It is advantageous that resilient contact structures 376 be inserted sufficiently through the support substrate so that their bottom (as viewed) ends extend slightly (e.g., 5–30 mils) beyond the bottom surface 372*b* of the support substrate 372. This provides a solderable surface for the corresponding solder balls 378. In such a case, the bottom ends of the resilient contact structures 376 would be embedded (not shown) within the solder balls 378. Additionally, the portions of the resilient contact structures 376 which extend beyond the bottom (as viewed) surface of the support substrate 372 can be bent (e.g., at ninety degrees, against the bottom surface of the support substrate) to secure the resilient contact structures in the support substrate, prior to mounting the solder balls 378.

In this manner, a socket assembly is provided, consistent with the many embodiments disclosed both hereinabove and hereinbelow, which has resilient contact structures extending from its top surface to make pressure connections to terminals of an electronic component (e.g., LGA semiconductor package, BGA semiconductor package, bare semiconductor die, etc.) and non-resilient, solderable contact structures disposed on its bottom surface to make permanent connections to another electronic component such as a mother board.

In the several socket embodiments disclosed herein (hereinabove and hereinbelow), the support substrate is suitably a rigid member, such as a conventional circuit board, or is a flexible member which can be caused to behave in a suitably rigid manner (rigidized) by a peripheral ring (e.g., the frame element 330 described hereinabove, the frame element 430 described hereinbelow, etc.).

In the several socket embodiments disclosed herein, the socket advantageously includes resilient contact structures, which either are rigidly mounted to the top surface of the support substrate or are "poked" into the top surface of the support substrate (including through the support substrate), to make pressure connections to another electronic component such as a semiconductor package or a bare (unpackaged) semiconductor die. These top interconnection elements may be conventional resilient contact structures such as elongate members formed of phosphor bronze or beryllium copper, or may be the composite interconnection elements (overcoated cores) disclosed herein. An advantage of the techniques disclosed herein is that the resilient contact structures extending from the top surface of the support substrate are mounted to the support substrate without requiring the use of joining materials and techniques such as soldering or brazing. The use of solder balls as the contact structures on the bottom surface of the support substrate is preferred, to make permanent connections between the support substrate and another electronic component such as a mother board. Hence, the apt use of the term "solder-down socket". It is, however, within the scope of this invention that contact structures such as pins could be employed on the bottom surface of the substrate.

BGA Socket

The ball grid array (BGA) semiconductor package is becoming a popular format for mounting semiconductor packages to PCBs. Although industry standards are not fixed, and practices vary from vendor-to-vendor, exemplary dimensions of approximately 30 mil diameter spherical balls, on 50 mil spacing (from one ball to an adjacent ball) will be used in the examples that follow. As a general proposition, these dimensions are relatively easy to maintain, using various techniques for fabricating solder balls on semiconductor packages.

Figure 4:
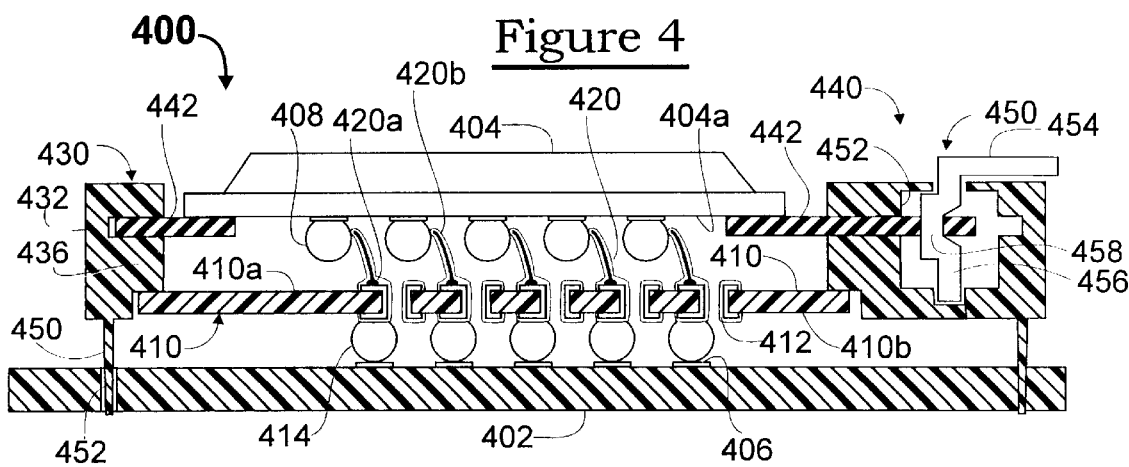
FIG. 4 is a cross-sectional view of an embodiment of a BGA socket, according to the invention.

FIG. 4 illustrates an embodiment of a solder-down (surface mount) BGA socket 400 for mounting to a printed circuit board (PCB) 402 and for making pressure contacts to the pads of a BGA package 404 or comparable electronic component. As before, the term "socket" refers to an electronic component having interconnection elements, suitable for making electrical connections to another electronic component. Generally, most of the advantages and variations attendant the previous embodiment 300 are applicable to this embodiment 400.

The circuit board 402 is generally same as the circuit board 302 described in the previous embodiment 300, and has a plurality (five of many shown) of terminals (contact areas) 406 disposed on its top (as viewed) surface. The BGA package 404 has a plurality (five of many shown) of solder balls (external connection points) 408 disposed on its bottom surface 404*a*. The socket 400 effects a plurality of connections between respective terminals (pads) of the PCB 402 and the balls of the BGA package 404 in the following manner.

The socket 400 includes a support substrate 410 formed, for example, of conventional PCB material, and is provided with a plurality (five of many shown) of plated through holes 412, in a conventional manner. Each through hole 412 has portions residing on the top surface 410*a* and bottom surface 410*b* of the support substrate 410. A plurality (five of many shown) of solderable raised contact structures 414 (such as conventional solder balls) are disposed on the bottom surface 410*b* of the support substrate 410, on bottom-surface portions of the plated through holes 412. Many techniques, such as those techniques described hereinabove, for mounting these solder balls 414 to the bottom surface of the support substrate, are suitable.

Another suitable technique for mounting solder balls to an electronic component is described hereinbelow, with respect to FIGS. 7A–7C.

A plurality (five of many shown) of free-standing resilient contact structures 420 (such as the composite interconnection elements of the present invention) are mounted to the top surface 410*a* of the support substrate 410 by bonding a core to the top-surface portions of the plated through holes 412, and overcoating the cores with a hard material, as described in greater detail hereinabove. These interconnection elements 420 may extend, for example, approximately 50–100 mils from the top surface 410*a* of the support substrate 410.

Each of the interconnection elements 420 is anchored to the support substrate at its base (proximal end) 420*a*, and has a tip (distal end) 420*b*. These tips 420*b* are preferably coplanar with one another. For a given BGA semiconductor package 404, having balls 408 disposed in a given pattern and at a given pitch, the interconnection elements are formed such that the tips 420*b* are disposed in a pattern and at a pitch corresponding to that of the balls 408.

The socket 400 thus has a plurality of free-standing interconnection structures 420 extending from the top surface 410*a* of the support substrate 410, and a plurality of solder 30 balls 414 disposed on the bottom surface 410*b* of the support substrate 410.

Preferably, for making contact to solder balls (408), the interconnection elements (420) have a final top overcoat (outer) layer of solder (compare the final top overcoat 220 of the multilayer (composite) interconnection element described in FIG. 2A). Such an outer layer (220) may be applied by any suitable technique, such as by plating, or by dipping, for example, so that the final outer layer has a thickness of 50–300 microinches.

The elements described thus far are generally identical to those of the previous embodiment 300. In use, the socket 400 is soldered down onto the PCB 402, by reflowing the solder balls 414, as in the previous embodiment 300.

The principal differences between the embodiments 300 and 400 reside in the shape of the interconnection elements (320, 420), the type of terminals on the respective LGA (304) and BGA (404) packages, and the manner in which contact is effected between the tips (320*b*, 420*b*) of the interconnection elements (320, 420) and the external interconnect points (308, 408) of the respective semiconductor package (304, 404). This latter difference, and the difference of direction in which contact forces are applied and reacted, also necessitates an additional mechanism, as described hereinbelow.

In this embodiment 400, a frame element 430 provides two principal functions: (1) maintaining alignment between the solder balls 408 of the BGA package 404 and the tips 420*b* of the interconnection elements 420, in a manner similar to that of the previously-described embodiment; and (2) providing a mechanism whereby the solder balls 408 may be urged laterally (across the page, as viewed) against the tips 420*b* of the interconnection elements 420 to make a pressure connection therewith (in contrast to the spring element 340 urging the pads 308 of the LGA package 304 downward against the tips 320*b* of the interconnection elements 320, in the previous embodiment 300).

The frame element 430, as in the previous embodiment 300, has a body portion 432 disposed around the periphery of the support substrate 410, and is provided with a region 436 of decreased diameter (transverse dimension) forming a step against which the top surface 410*a* of the support substrate 410 rests and/or is affixed.

In this embodiment 400, the interconnection elements 420 are shaped in a manner such as was illustrated in FIG. 1D, so as to react a contact force applied laterally (across the page, from left-to-right, as illustrated) to their tips 420*b*. Additionally, a mechanism 440 is provided whereby the BGA package may be moved laterally (generally parallel to the top surface of the support substrate 410) to provide an effective pressure contact between the external connection points (solder balls) 408 of the semiconductor package 404 and the tips 420*b* of the resilient contact structures 420.

Figure 4A:
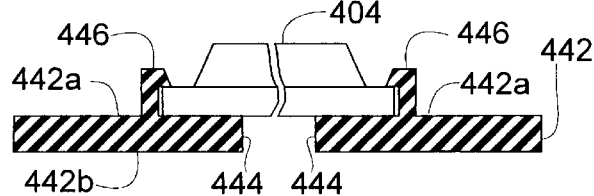
FIG. 4A is a cross-sectional view of another embodiment of a BGA socket, according to the invention.

An exemplary mechanism 440 is illustrated in FIG. 4, and includes a flat, planar element 442 (see also FIG. 4A) having an upper surface 442*a*, a lower surface 442*b*, and a central opening 444. The central opening 444 is sufficiently large to receive an entire array of solder balls 408, and is smaller than the periphery of the BGA semiconductor package 404. The BGA semiconductor package 404 is supported on the top surface 442*a* of the flat planar element 442, and is securely retained thereto with any suitable means, such as a number (two shown in FIG. 4A) of pawls 446 disposed on the top surface 442*a* of the flat planar element 442. Preferably, at least three pawls 446 are provided, one on one side edge of a square semiconductor package and two on an opposite side edge of the square semiconductor package. Additional locating features (not shown) may optionally be provided on the top surface 442*a* of the planar element 442 to ensure accurate positioning of the BGA package 404, such as at positions corresponding to the corners of the BGA package. As illustrated, the planar (slider) element 442 is free to slide back and forth in slots (not numbered) provided in the frame body 432, extending into the inner surface thereof. The slots are at least one recess extending into the inner surface of the frame body, and permit the planar element to slide back and forth in the frame element in response to the cam lever being rotated.

The mechanism 440 also includes means for moving the planar element 442, and package 404 mounted thereto, laterally with respect to the frame element 430 and the support substrate 410 affixed thereto. This means for moving suitably includes a cam lever 450, extending from a cavity 452 in the body 432 of the frame element 430.

The cam lever 450 is generally L-shaped, having a one leg (actuation arm) 454 disposed outside of the frame element 430, and another leg portion 456 disposed within the cavity 452 in the frame element 430. The leg portion 456 has a region 458 which is offset from a main axis of the leg portion 456. The offset region (portion) 458 of the leg 456 extends through a hole in the slider 442.

In use, a BGA package 404 is mounted (e.g., by clips 446) to the planar "slider" element 442. The arm 454 is rotated (e.g., 90 or 180 degrees) to cause the slider 442 to move (from left-to-right) the solder balls 408 of the semiconductor package 404 into intimate pressure contact with the tips 420*b* of the interconnection elements 420, in a direction which is generally parallel to the top surface 410*a* of the support substrate. In its movements, the slider element is guided by the slots in the frame body. In the illustration of FIG. 4, the slider is shown in its initial, pre-pressure position. To replace or remove the BGA 404, the arm is rotated to the position illustrated in FIG. 4.

A difference between the embodiments 300 and 400 is that whereas the embodiment 300 utilizes vertical (as viewed) contact forces which could deform the support substrate 310, the embodiment 400 utilizes lateral contact forces to achieve an essentially zero insertion-force ("zif") socket.

Various features of the previously-described embodiment 300 may be incorporated into the embodiment 400, including: alignment pins 450 (compare 350) extending from the frame element, and corresponding holes 452 (compare 352) through the PCB; different shape body portions of the frame element, and establishing predetermined dimensions for solder joints formed by the balls (414); and optional stiffener elements (not shown, compare 360 in FIG. 3A) to prevent accidental damage to the tips of the interconnection elements.

As in the previous embodiment 300, it is within the scope of this invention that the bases 420*a* of the interconnection elements 420 are arranged in a pattern and at a pitch which is dissimilar from the pattern and pitch of the tips 420*b*. It is also within the scope of this invention that the solder balls 414 on the bottom surface of the support substrate 410 be arranged in a pattern and at a pitch which dissimilar from the pattern and pitch of the bases 420*a*. It is within the scope of this invention that the hard material overcoating the core of the composite interconnection elements (420) is dendritic, or the like, exhibiting microprotrusions.

The embodiment 400 provides a facile, inexpensive, reliable, zero insertion force ("zif") type socket for receiving BGA semiconductor packages. Since a spring clip (compare 346) is not required, the top of the package 400 is entirely open, allowing for easy insertion and removal of BGA packages. In both socket embodiments 300 and 400, the socket has a "standard" PCB footprint.

Interconnection elements (420) formed from a wire core of approximately 1 mil diameter, and overcoated with approximately 1 mil of hard material, will have an overall diameter of approximately 3 mils. At their tips (420*b*) the diameter may be slightly larger, such as approximately 5 mils. Typical solder balls (408) of a BGA package (404) will have a diameter of approximately 30 mils.

It should clearly be understood that in the socket embodiments presented herein, it is not necessary that the resilient contact structures disposed atop the support substrate be the composite resilient interconnection elements described herein. The invention is applicable to any resilient contact structure (spring), including traditional one-piece metal springs, stamped parts, or the like, and may simply be inserted into via holes in the support substrate for stability. Moreover, the support substrate can be of virtually any construction and material that has electrical paths from contact areas on its top surface to contact areas on its bottom surface. Although conventional circuit boards having plated through holes come quickly to mind, the support substrate could simply be a planar insulating material having conductors (e.g., wires) passing therethrough from the top surface to the bottom surface thereof.

Figure 4B:
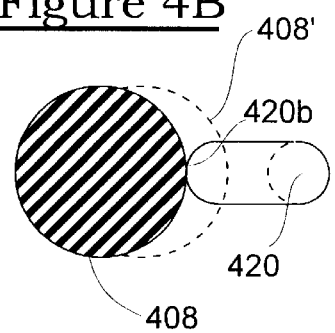
FIG. 4B is a top view, partially in cross-section, of an interconnection element making contact to a solder ball, according to the invention.

FIG. 4B illustrates the tip 420*b* of an interconnection element 420 contacting the surface of a solder ball 408 at a point which is exactly centered with respect to the solder ball 408. Generally, it is desired that the tip 420*b* of the interconnection element 420 deflect approximately 4–6 mils in response to actuating the cam lever 454. This is illustrated by the ball 408' shown in dashed lines. The interconnection element 420 will deflect, from left-to-right as viewed in the figure, in response to this movement of the solder ball 408. It is this left-to-right deflection, and the physical (including material) characteristics of the interconnection element, that ultimately determines the contact force applied by the tip 420*b* of the interconnection element 420 to the solder ball 408. A left-to-right deflection of approximately 6 mils and a resulting contact force of approximately 15–150 grams is preferred.

It is within the scope of this invention that a mechanism be provided whereby the support substrate 410 rather than the package 404 itself be moved, to effect the desired pressure connection.

Evidently, if the point whereat the tip of the interconnection element (420) is not exactly centered on the solder ball (408), there will be a tendency for the interconnection element to skew (deflect) upward or downward (as viewed in FIG. 4B), resulting in a somewhat attenuated left-to-right deflection (as viewed in FIG. 4) and consequent somewhat diminished contact force. As a general proposition, it has been determined that slight misalignments of the contact tips 420b will not significantly adversely affect the resulting contact force, and that the tolerance, given the exemplary dimensions set forth hereinabove, is approximately ±5 mils.

Figure 4C:
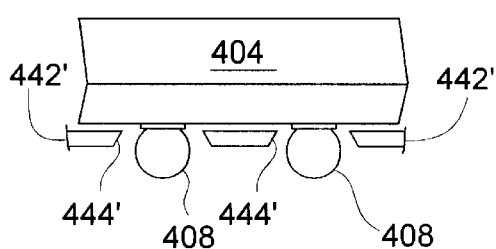
FIG. 4C is a cross-sectional view of another embodiment of a BGA socket, according to the invention.

FIG. 4C illustrates an alternate technique of securing a BGA-type semiconductor package (404) to the sliding plate (442). In this example, the sliding plate 442' (compare 442) is provided with a plurality (two of many shown) of holes 444', rather than one large hole (compare 444). Each hole 444' aligns with a corresponding solder ball 408 of a BGA package 404. As illustrated by the figure, the holes 444' are tapered (e.g., conical), having a smaller diameter at the top (as viewed) surface of the sliding plate 444' than at the bottom (as viewed) surface of the sliding plate. The diameter of a hole 444' at the top surface of the sliding plate is sufficient to permit the solder ball 408 to pass freely therethrough, for example 2–5 mils greater than the diameter of the solder ball.

The sliding plate 442' has a thickness which is less than half the diameter of the solder balls, for example approximately 10 mils. When the package 404 is disposed on the sliding plate 442', the sliding plate 442' will be disposed in line with the upper (as viewed) hemispheres of the solder balls 408 (i.e., above their horizontal centerline, or equator). In this manner, when the sliding plate 442' is moved (e.g., by rotating the arm 456, shown in FIG. 4), the bore of each hole through the sliding plate will contact ("grab") each solder ball, resulting in (1) the BGA package being moved laterally to cause pressure contact with the tips (420b) of the interconnection elements (420), and (2) a downward (as viewed) force being exerted on the solder balls. Said downward force will secure the BGA package 404 to the sliding plate without requiring external means, such as the clips 446 shown in FIG. 4A.

The technique described with respect to FIG. 4C eliminates problems accruing to any misalignment between the package balls (408) and the edge(s) of the package body (404), which has been observed to be up to 5 mils. Given a "nominal" intended spring deflection of 6–8 mils, such tolerances would be intolerable. (Note that in FIG. 4A, the pawls 446 establish the position of the package 404 atop the sliding plate 442.) Thus, by referencing off the package balls themselves, deflections of the resilient contact structures (420) are more repeatable, from package-to-package (such as when replacing packages). It is within the scope of the invention, however, that a sliding plate having holes for each package ball could also be provided with pawls (e.g., 446) positioned to grossly locate the package without precisely determining the package's position on the sliding plate.

It is generally preferred that the function of holding the electronic component (e.g., 404) down onto the sliding plate (e.g., 442) be accomplished entirely by the arrangement of holes (e.g., 444') in the sliding plate, as described with respect to FIG. 4C. However, for certain electronic components (e.g., 404), this may not be an entirely effective method of holding the electronic component down onto the sliding plate. In such instances, mechanisms such as the aforementioned pawls (446) serve an important function.

Figure 4D:
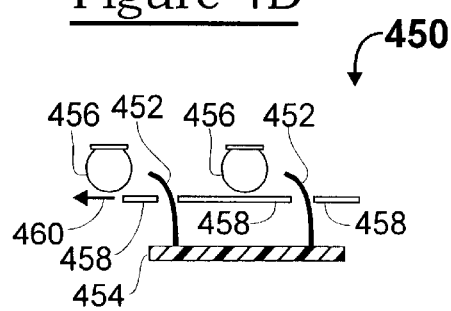
FIG. 4D is a cross-sectional view of another embodiment of a BGA socket, according to the invention.

FIG. 4D illustrates an alternate technique of making connections between resilient interconnection elements and terminals (e.g., solder balls) of an electronic component (e.g., BGA-type semiconductor package). Whereas in the aforementioned embodiment 400 the support substrate (410) remains stationary and the electronic component (404) is moved so that its terminals (408) make a pressure contact with the tips (420b) of the resilient interconnection elements (420), in this embodiment it is the resilient interconnection elements that are moved so that their tips contact the stationary terminals of the electronic component. This is illustrated, somewhat schematically, in FIG. 4D which shows an embodiment 450 having a plurality (two of many shown) of resilient interconnection elements 452 mounted to and extending from a support substrate 454. Plated through holes (compare 412) and solder balls (compare 414) are omitted from this view, for illustrative clarity. As mentioned, it is desired that a pressure contact be made between the tips of the resilient interconnection elements 452 and terminals 456 (compare 408) of an electronic component (not shown, compare 404). To this end, a planar sliding member 458 is provided having a plurality of holes through which the resilient interconnection elements 452 extend. In this regard, the sliding member 458 is comparable to the stiffener element 360 of FIG. 3A, with the exception that the sliding member 458 is intended to move (horizontally, as indicated in the figure by the arrow labelled 460). Such movement of the sliding member 458 can be provided in any suitable manner, such as with a cam mechanism (compare 440).

In a general sense, the sockets 300 and 400 (including the embodiment 450) are both intended for the same purpose—namely, to releasably (removably) connect a semiconductor package to a circuit board. Generally, this involves supporting any resilient contact structure atop a support substrate, and said resilient contact structures are not limited to the composite interconnection elements of the present invention. The bottom surface of the support substrate is provided with contact structures, which are preferably solder balls, but which are not limited thereto. The support substrate may then be soldered down onto a circuit board, the contact structures on the bottom surface of the support substrate contacting corresponding contact areas on the circuit board. In any suitable manner, selected ones of the resilient contact structures atop the support substrate are connected, via the support substrate, to corresponding ones of the contact structures on the bottom surface of the support substrate. A difference between the two embodiments is that in the embodiment 300 pressure contact with external connections of a semiconductor package are made with a contact force which is generally normal to the top surface of the support substrate, and in the embodiment 400 pressure contact with external connections of a semiconductor package are made with a contact force which is generally parallel to the top surface of the support substrate. Variations of these two embodiments are set forth hereinbelow.

Flat Elongate Elements

It may be desired, in certain applications, to provide a "broader" point of contact between the tips of the interconnection elements and the package terminals, whether the package terminals be pads (308) or balls (408). In the main, in the embodiments described hereinabove, the composite interconnection elements have included a wire (round cross-section) core and a generally conformal (also round in cross-section) overcoat.

It is well within the scope of this invention that the elongate core element can be fabricated from a flat sheet of metal (foil), rather than from a wire. Generally, a soft metal foil is patterned to have a plurality of tabs, which are bent out-of-plane with respect to the foil, and which are subsequently overcoated with a hard material, to form composite interconnection elements. These processes are described in greater detail in the aforementioned U.S. patent application Ser. No. (Attorney Docket 95–551), for example, with respect to FIGS. 4A–4D, 5A–5D, 6A–6D and 7A–7B, described therein.

Figure 5A:
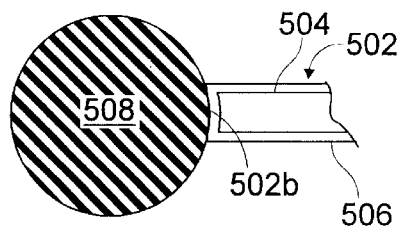
FIG. 5A is a top view, partially in cross-section, of an interconnection element making contact to a solder ball, according to an alternate embodiment of the invention.

FIG. 5A illustrates, from a perspective similar to that set forth in FIG. 4B, an interconnection element 502 formed of a flat metal elongate member (tab) 504 that has been overcoated with a hard material 506, in juxtaposition with a solder ball 508. For example, the tab 504 may be 1–2 mils thick (into the page, as viewed), with an overcoat having a thickness of approximately 1 mil. The overall width of the tab (vertically, in the drawing) is suitably approximately 5–10 mils. Preferably, the tip 502b of the interconnection element would be slightly curved (arcuate), to approximate the curvature of the solder ball 508 coming into contact with the tip. This generally provides a "self-centering" feature, wherein the interconnection element will tend to remain in alignment with the center of the solder ball. However, it should be understood that the contact area between the interconnection element 502 and the solder ball 508 will tend to be larger than the contact area between the interconnection element 420 and the solder ball 408 (compare FIG. 4B), which will lower the contact pressure, all other things being equal—a consideration which must be taken into account when implementing the composite interconnection element as a flat tab structure rather than as an overcoated wire. In the microelectronic milieu, contact forces in the range of 2–150 grams, such as between 10 and 100 grams, are generally considered to be nominal.

Figure 5B:
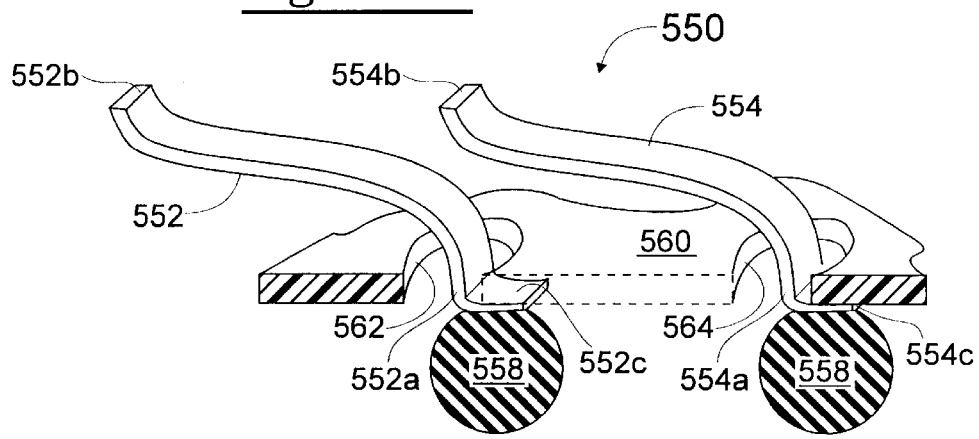
FIG. 5B is a perspective view of a portion of an LGA socket, according to an alternate embodiment of the invention.

FIG. 5B illustrates another use of elongate tab-elements, rather than wires, as the core of an interconnection element, in a context comparable to the LGA package of FIG. 3.

In this embodiment 550, a plurality (two of many shown) of elongate elements 552 and 554 are formed from a metal sheet (foil). Each elongate element 552 and 554 has a base portion 552a and 554a, and a tip 552b and 554b, respectively. The tips of the elongate elements are suited to contacting pads of an LGA semiconductor package, in the manner of the tips 320b described hereinabove. The spring-shape of the elongate elements 552 and 554 closely resembles the spring-shape of the interconnection elements 320.

In this embodiment 550, each elongate element 552 and 554 has a base portion 552c and 554c disposed at its base end 552a and 554a, respectively. These base portions 552c and 554c are preferably coplanar with one another. The elongate elements (552, 554) are resilient contact structures which are prefabricated, and are suitably the composite interconnection elements of the present invention.

In order to support a plurality of such elongate elements in a prescribed spatial with one another, such as in rows or arrays, a support element 560 (compare 266) is provided. A portion of the support element 560 is shown in phantom (dashed lines), to permit a better view of the base portion 552c of the elongate element 552. The support element 560 is suitably formed of Kapton (tm), or a more rigid material such as ceramic, and is provided with a plurality (two of many shown) of openings 562 and 564 aligned with the base ends 552a and 554a of the elongate members 552 and 554, respectively. In this manner, the top (as viewed) surfaces of the base portions 552c and 554c may be affixed to the bottom (as viewed) surface of the support element 560, immediately adjacent a respective opening therein. This establishes the desired spacing between elongate elements.

As illustrated in FIG. 5B, solder balls 558 (compare 314, 414) are readily formed directly on the bottom (as viewed) surfaces of the base portions 552c and 554c of the elongate elements 552 and 554, respectively.

In FIG. 5B, the elongate elements 552 and 554 are not explicitly shown to be overcoated. It is within the scope of this invention, in many of the embodiments set forth herein, that the interconnection elements are monolithic, rather than composite.

Figure 5C:
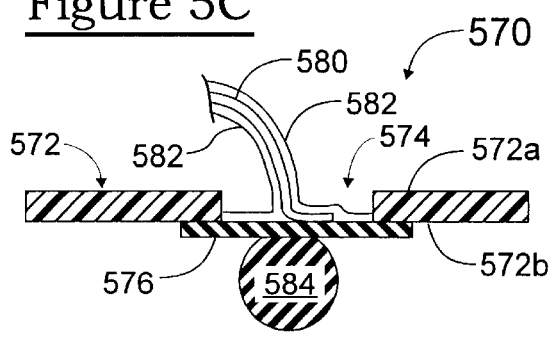
FIG. 5C is a cross-sectional view of a portion of an alternate embodiment of a solder-down socket, according to the present invention.

FIG. 5C illustrates another embodiment 570 of a solder-down socket, according to the present invention. In this embodiment, a support substrate 572 having a top surface 572a and a bottom surface 572b is provided with a plurality (one of many shown) of holes 574 extending therethrough in a predetermined pattern. At the location of each hole 574, a metallic pad 576 is disposed on the bottom surface of the support substrate 572, aligned with the hole 574.

A plurality (one of many shown) of individual core elements 580 such as of the type (e.g., 552) described with respect the previous embodiment 570, or of any suitable type described herein, including either tabs (ribbons) or wires are attached to the top (as viewed) surface of the metallic pad 576, within each hole 574. In this view, only the lower (as viewed) portion of the core element 580 is shown, for illustrative clarity. The core element 580 may then be overcoated with a suitable material 582, as described hereinabove, to impart a desired resiliency to the resulting composite interconnection element and to securely anchor the interconnection element to the pad 576. In the manner described herein (e.g., with respect to the previous embodiment 570), a plurality (one of many shown) of solderable raised contact structures (e.g., solder balls) 584 can be disposed on the bottom (as viewed) surface of the metallic pad 576.

Figure 5D:
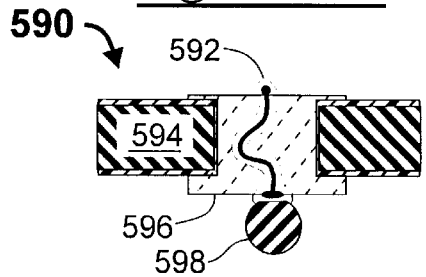
FIG. 5D is a cross-sectional view of a portion of an alternate embodiment of a solder-down socket, according to the present invention.

FIG. 5D illustrates another embodiment 590 of a solder-down socket, according to the present invention. In this embodiment, a plurality (one of many shown) of interconnection elements 592 formed in a manner similar to the aforementioned interconnection elements 264 (see FIGS. 2F and 2G) are loosely held within a plurality (one of many shown) of holes in a support substrate 594 by a suitable material 596 (such as an elastomer) filling the holes so that the tips (top end, as viewed) of the interconnection elements and extend from the top (as viewed) surface of the support substrate 594.

Prior to supporting the interconnection elements 592 in the support substrate 594, solder balls 598 can be mounted to the bottom (as viewed) ends of the interconnection elements 592. Alternatively, the solder balls can be affixed to the bottom ends of the interconnection elements after the interconnection elements are supported within the support substrate. Alternatively, a metallic pad (compare 576, FIG. 5C) can be disposed across the opening of the hole through the support substrate, so that the interconnection element extends from one surface of the metallic pad and the solder ball is mounted to the opposite surface of the metallic pad.

As is generally true of all the solder-down socket embodiments described herein, it is not necessary that the resilient contact structure disposed atop the support substrate (572) be one of the composite interconnection elements of the present invention.

Further, as is evident from this embodiment 570, the resilient contact structure may simply extend upward from the support substrate, without being mounted to the top surface thereof. In this embodiment, the resilient contact structure extending upward from the support substrate is, however, mounted to the top surface of an element (576) disposed on the bottom surface (572b) of the support substrate (572).

Paired Interconnection Elements

As described in greater detail in FIGS. 18A and 18B of the aforementioned U.S. patent application Ser. No. 08/452,255, certain advantages accrue to interconnection structures which are pairs of side-by-side, generally identical, interconnection elements, each pair of interconnection elements making redundant pressure connections to a single terminal of an electronic component. These advantages include ensuring that at least one reliable pressure connection is made (per terminal) in instances where dirt is present on the terminal (e.g., in the way of filmy or oily contaminants).

The concept of using two (or more) interconnection elements for effecting each connection to a terminal of an electronic component also has utility in the context of the sockets of the present invention.

Figure 6A:
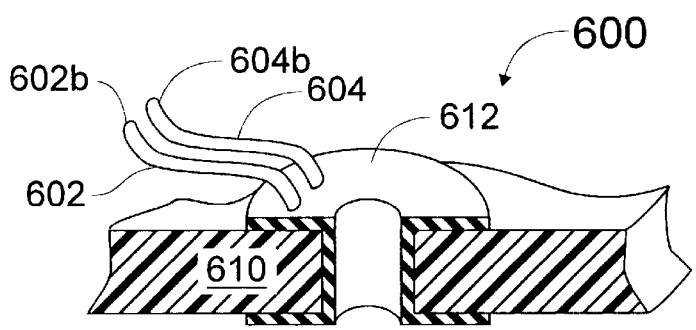
FIG. 6A is a perspective view of a technique for mounting pairs of interconnection elements as interconnection structures to a substrate, according to the invention.

FIG. 6A illustrates an embodiment 600 of the invention wherein an "interconnection structure" is formed as a pair of interconnection elements 602 and 604 mounted to and extending generally parallel to one another from an area of a conductive element 612 (compare 312) on a support substrate 610 (compare 310). Generally, the two interconnection elements 602 and 604 are formed as composite interconnection elements by first mounting the two individual wires to the conductive element 612, then overcoating the pair of wires in a single step (e.g., by plating), along with all other pairs of wires that have been mounted to remaining conductive elements. In this manner, a redundant contact can be made by the two tips 602*b* and 604*b* (compare 320*b*) of the two interconnection elements 602 and 604, respectively, to a single terminal (e.g., external connection point) of an electronic component (not shown, compare one of the terminals 308 on the electronic component 304 in FIG. 3), thereby generally assuring that at least one of each pair of interconnection elements will make good contact with the terminal of the electronic component. In the illustration of FIG. 6A, the tips 602*b* and 604*b* of the resilient contact structures 602 and 604, respectively, are shaped and oriented to make an effective pressure contact (e.g., with external connection points of an LGA-type semiconductor package) in a direction that is generally normal to the top surface of the support substrate 610.

Figure 6B:
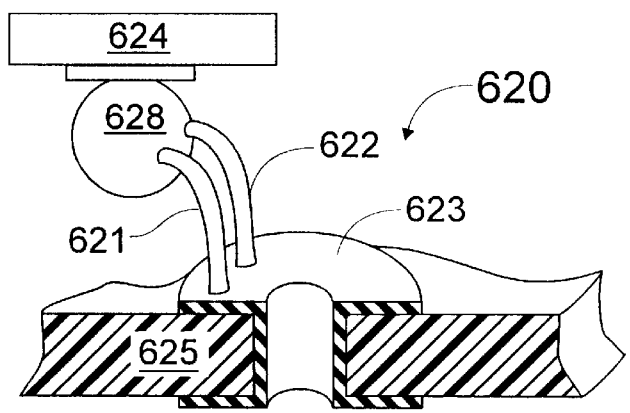
FIG. 6B is a perspective view of another technique for mounting pairs of interconnection elements as interconnection structures to a substrate, according to the invention.
Figure 6C:
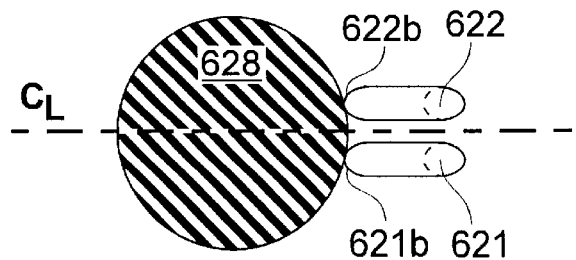
FIG. 6C is a top plan view of a pair of interconnection elements contacting terminal of an electronic component (e.g., an external ball bump connection of a semiconductor package), according to the invention.

FIGS. 6B and 6C illustrate another advantageous feature accruing to the use of pairs of interconnection elements to make a single connection to a solder ball 628 of an electronic component 624. This example is similar to the embodiment 400 described hereinabove with respect to FIGS. 4 and 4B. In this example, a pair of two interconnection elements 621 and 622 (compare 420) are mounted to a single conductive area 623 of a support substrate 625 (compare 410). The interconnection elements 621 and 622 are located side-by-side, and are generally parallel to one another. As best viewed in FIG. 6C, the tips 621*b* and 622*b* of the interconnection elements 621 and 622 are shaped and oriented to make contact with the solder ball 628 on either side of a centerline (labelled "$C_L$" of the solder ball 628 in a direction which is generally parallel to the top surface of the support substrate 625. Using the exemplary dimensions set forth hereinabove (solder ball diameter ≈30 mils, interconnection element diameters ≈3 mils), the interconnection elements 621 and 622 are advantageously spaced approximately 5–10 mils apart from one another, or approximately 2–5 mils from the centerline of the solder ball. In this manner, not only is one assured that at least one of the two interconnection elements of each pair comprising an interconnection structure will make reliable contact to the solder ball, but the ball is essentially "captured" by the tips of the interconnection elements.

In this manner, an "interconnection structure" is provided that includes a plurality (two, or more) of resilient contact structures (602, 604) acting "in concert" with one another, extending generally parallel to one another from the top surface of the support substrate (610), and acting "in concert" with one another to make a single connection to a terminal (e.g., 628) of an electronic component.

Figure 6D:
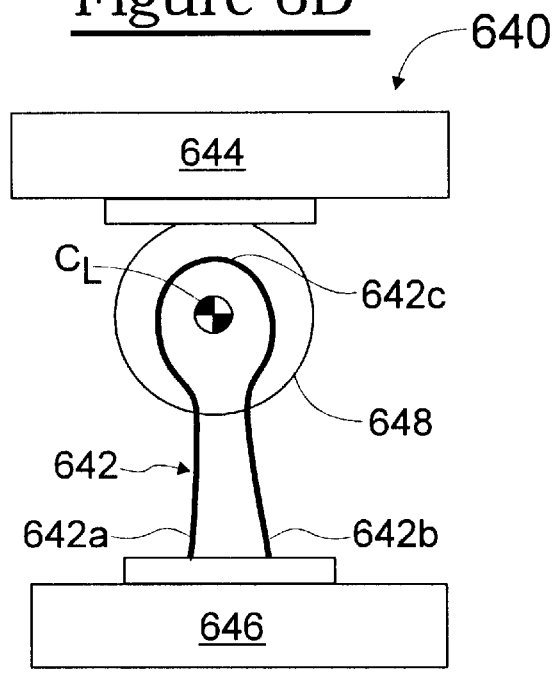
FIG. 6D is a side view of an interconnection element making contact to a ball bump terminal of an electronic component, according to another embodiment of the invention.

FIG. 6D illustrates another embodiment 640 of the present invention, principally directed at making contact to solder ball terminals 648 (compare 408) of an electronic component 644 (compare 404). The view of FIG. 6D is taken at 90° with respect to the view of FIG. 4, and illustrates a composite interconnection element 642 which is mounted to a conductive area on a support substrate 646 (compare 410). In this illustration, details of overcoating a core are omitted, for illustrative clarity.

In this example 640, the interconnection element 642 is formed as a generally U-shaped loop, having both ends 642*a* and 642*b* mounted to the support substrate 646. A midportion 642*c* of the interconnection element 642 is shaped in an arcuate, preferably forming a substantial portion of a circle. The center of the arcuate portion 642*c* is coincident (aligned) with the center of the solder ball, as indicated by the point labelled "$C_L$" in the figure. In this manner, a solder ball 648 of a semiconductor package 644 will "nest" in the arcuate midportion 642*c* of the interconnection element 642, so that it would be relatively impossible for the interconnection element 642 to be deflected in any but the prescribed direction (out of the page, towards the reader, in this illustration), such as from side-to-side (across the page, in this illustration).

Figure 6E:
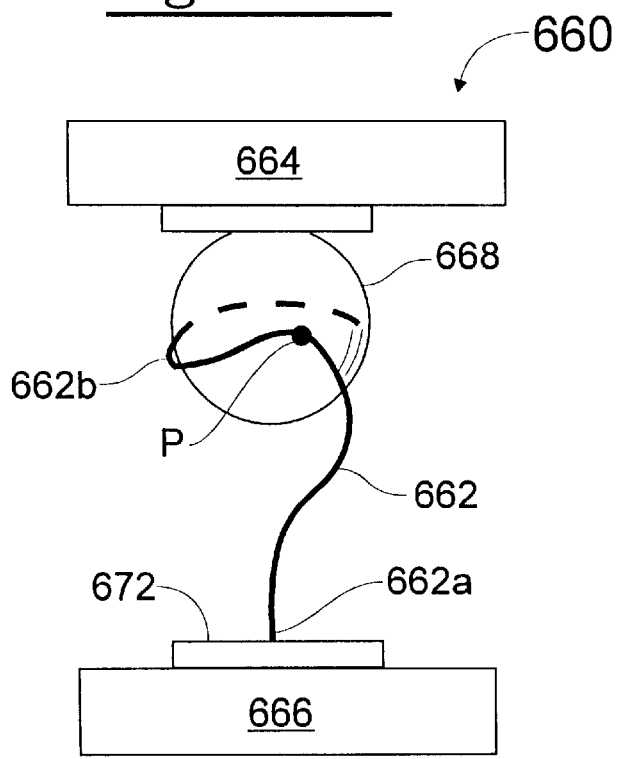
FIG. 6E is a side view of an interconnection element making contact to a ball bump terminal of an electronic component, according to another embodiment of the invention.

FIG. 6E illustrates yet another embodiment 660 of an interconnection element 662 making pressure contact with a solder ball 668 of an electronic component 664. This embodiment differs dramatically from the embodiments previously described in that pressure contact is made in the vertical (as viewed) direction, rather than left-to-right (as illustrated in FIGS. 4 and 6B) or out of the page, as illustrated in FIG. 6D). Again, the interconnection element is shown without its overcoat, for illustrative clarity.

An end 662*a* of the interconnection element 662 of this embodiment 660 is mounted in any suitable manner to a conductive area 672 (compare 312, 412) of a support substrate 666 (compare 310, 410). The interconnection element 662 is shaped in any suitable manner so as to be resilient in the vertical (as viewed) axis (compare FIGS. 1A and 1B). An end (tip) portion 662*b* of the interconnection element 662 has a complex shape, as follows. Commencing at a point labelled "P", which is comparable to the tips of the interconnection elements of the previously-described embodiments, the interconnection element 662 is shaped to have an arcuate shape, said arcuate shape having a diameter slightly (e.g., 25%) less than the diameter of a solder ball intended to be "cradled" by the tip portion 662*b*. In this manner, a solder ball 668 can be urged down onto, and received by the end portion 662*b* to effect a connection to the solder ball 668. In this regard, this embodiment 660 is similar to the LGA sockets described hereinabove, where the contacting force is in the vertical direction, but is particularly adapted to making contact to solder balls of BGA packages, rather than to pads of LGA packages. This embodiment is generally not preferred.

Fabricating Solder Balls/Bumps on an Electronic Component

As mentioned hereinabove, it is generally desirable to mount solder balls or solder bumps on electronic components for use, such as the external interconnection points of semiconductor packages.

The aspect of the invention described hereinbelow deals with a novel technique for providing solder balls or solder bumps on electronic components. As used herein, the term "solder" includes conventional lead-tin (Pb—Sn) solder compositions, as well as other solder or eutectic or low melting point compositions.

Figure 7A:
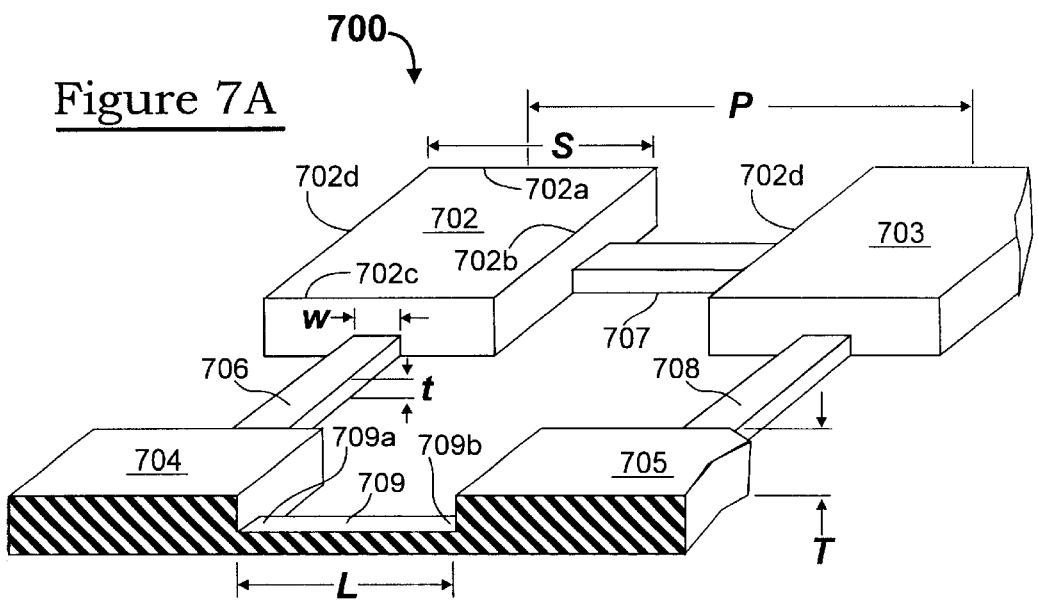
FIG. 7A is a perspective view, partially in cross-section, of a solder preform for use in attaching a plurality of ball bump type terminals to an electronic component, according to another aspect of the invention.
Figure 7B:
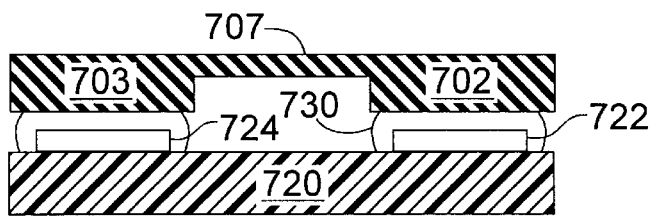
FIG. 7B is a side, cross-sectional view of the solder preform of FIG. 7A, in a subsequent step of the technique of attaching ball bumps to an electronic component, according to the invention.
Figure 7C:
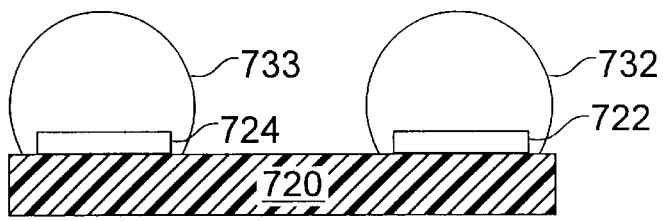
FIG. 7C is a side view, partially in cross-section, of ball bump terminals mounted to an electronic component, according to the invention.

FIGS. 7A–7C illustrate a technique of forming solder balls or solder bumps on an electronic component, such as the support substrates (310, 410) for sockets discussed hereinabove. It should be understood that the technique disclosed herein is equally applicable to forming solder balls or solder bumps on semiconductor packages.

FIG. 7A illustrates a preform (prefabricated structure) 700, formed of a solder material, having a plurality (two shown in full, two shown partially, of many) of spaced-apart, relatively large masses 702, 703, 704, 705 connected to one another by a plurality (three shown in full, one shown partially, of many) of relatively small solder bridges 706, 707, 708 and 709. (The bridges are considered to be relatively small solder masses.)

The solder masses 702 . . . 705 are relatively large, and are all preferably the same shape as one another. As illustrated, each solder mass, for example the solder mass 702 has four edges 702a, 702b, 702c and 702c, and is in a square shape. It is within the scope of this invention that the solder masses have shapes other than squares—for example, triangles or circles. The solder masses 702 . . . 705 have a thickness "T", and side dimension "S" (measured along an edge thereof).

The solder bridges 706 . . . 709 are relatively small, and are all preferably the same shape as one another. As illustrated, each solder bridge, for example the solder bridge 709 has two ends 709a and 709b, between which is defined a length "L". Each solder bridge 706 . . . 709 also has a width "W", and a thickness Exemplary dimensions for the solder masses 702 . . . 705 and solder bridges 706 . . . 709 are:

side dimension "S" of solder mass=30 mils;

thickness "T" of solder mass=8 mils;

length "L" of solder bridge=20 mils;

width "W" of solder bridge=5 mils; and thickness "t" of solder bridge=3 mils.

In this manner, the solder masses 702 . . . 705 are uniformly arranged at a pitch "P" of 50 mils (P=L+2S/2) and, as is evident, the solder bridges 706 . . . 709 will be quite "flimsy" (e.g., lacking in structural integrity) as compared with the solder masses 702 . . . 705.

It is within the scope of this invention that the solder masses be arranged in a pattern other than the rectangular array illustrated in FIG. 7A, and that the solder masses and solder bridges have different dimensions than those set forth above. For example, a range of dimensions suitable for microelectronic applications would be:

"S" is in the range of from 10 mils to 90 mils;

"T" is in the range of from 2 mils to 25 mils;

"L" is in the range of from 5 mils of 60 mils;

"W" is in the range of from 2 mils to 20 mils; and

"t" is in the range of from 1 mils to 10 mils.

Moreover, certain relationships, and preferred relationships, are evident from the exemplary dimensions and ranges of dimensions set forth hereinabove. For example (wherein "*" means multiply):

$S \geq L$, preferably $S = \geq 1.5*L$;

$S >> W$, preferably $S = \geq 5*W$;

$T >> t$, preferably $T \geq 2*t$;

$S > T$, preferably $S \geq 3*T$; and $L > W$, preferably $L \geq 4*W$.

The preform 700 is readily fabricated by known techniques of molding or punching (e.g., cold forming), so that the masses 702 . . . 705 are formed integrally with the bridges 706 . . . 709.

A preform 700 having thus been fabricated, it is now described how the preform is used to mount a plurality of external interconnect structures (i.e., as solder balls or solder bumps) to a surface of an electronic component.

FIG. 7B illustrates an electronic component 720 having a plurality (two of many shown) of conductive pads 722, 724 disposed in any suitable manner on an external surface thereof. (Compare, e.g., the pads 54 shown in the aforementioned U.S. Pat. No. 5,241,133.) As will become evident, the pads (722 and 723) are arranged in a pattern matching the layout of the solder masses (702 and 703), including being disposed at an pitch matching that of the solder masses.

Solder paste 730, preferably containing flux, is applied to the pads 722 and 723 by any suitable process such as by screen printing. Alternatively, the material 730 is simply solder flux, also applied by any suitable process such as by screen printing. Alternatively, the solder paste or solder flux is applied to the solder masses of the preform 700, rather than to the pads of the electronic component 720, in which case it may be acceptable to dip the entire preform in solder flux.

The preform 700 is brought to bear upon (disposed against) the electronic component 720 so that the solder masses align with corresponding pads. FIG. 7A illustrates the preform 700 positioned against the electronic component 720. As illustrated, it is preferable that the side dimension ("S") of each solder mass is at least ($\geq$) as large as the side dimension (not labelled) of a corresponding pad on the electronic component.

Next, the assembly of preform 700 and electronic component 720 is heated (in a furnace, not shown) to a temperature which is sufficient to reflow the material of the preform 700 (i.e., the solder masses and the solder bridges), without damaging the electronic component. The temperature required to melt (reflow) the solder masses is relatively low, as compared with a temperature which would damage a typical electronic component.

This results in a plurality (two of many shown) of individual, discrete interconnect structures (solder balls or solder bumps), labelled 732 and 734, being formed upon the pads 722 and 724, respectively, on the surface of the electronic component 720. The solder balls or solder bumps form upon (attach to, adhere to) the pads due to the "wetability" of the pads, and their final rounded shape, as illustrated in FIG. 7C, is a result of surface tension in during the liquid phase of the reflow process. In this process, the flimsiness of the solder bridges causes the solder bridges to sever, a portion of each solder bridge migrating (during reflow heating) to each of the adjacent solder masses, and becoming incorporated (subsumed) into the mass of the resulting solder ball or solder bump.

In this manner, a process has been described for fabricating solder balls or solder bumps on a wide variety of electronic components, such as the electronic component shown in the aforementioned U.S. Pat. No. 5,241,133, using a novel technique in lieu of prior art techniques such as are described in the aforementioned U.S. Pat. No. 4,700,276, U.S. Pat. No. 5,381,848, or U.S. Pat. No. 5,388,327.

As mentioned hereinabove, solder balls are of two types: (1) eutectic masses that melt upon reflow; and (2) masses such as of 90:10 lead:tin that are not melted. The solder balls (e.g., 732, 733) of the present invention fall into the first category.

Although not shown in FIGS. 7A–7B, it is within the scope of this invention that the solder preform 700 be disposed on a carrier, such as a sheet of aluminum, which will provide support for the solder preform during handling of same. Any suitable material may be used for the carrier which is non-wettable (the solder will not stick aggressively to the carrier, especially when the solder is reflowed), and capable of withstanding the heat associated with reflowing the solder preform.

Additionally, the concept of a solder preform lends itself well to providing a plurality of solder preforms on a tape (i.e., a long carrier) so that a series of solder preforms can automatically (by machinery, not shown) be advanced (in the manner of a conveyor belt)into position to be reflowed onto a corresponding series of electronic components.

Although the invention has been illustrated and described in detail in the drawings and foregoing description, the same is to be considered as illustrative and not restrictive in character—it being understood that only preferred embodiments have been shown and described, and that all changes and modifications that come within the spirit of the invention are desired to be protected. Undoubtedly, many other "variations" on the "themes" set forth hereinabove will occur to one having ordinary skill in the art to which the present invention most nearly pertains, and such variations are intended to be within the scope of the invention, as disclosed herein. Several of these variations are set forth in the parent case.

For example, in any of the embodiments described or suggested herein where a masking material (e.g., photoresist) is applied to a substrate and patterned such as by exposure to light passing through a mask and chemically removing portions of the masking material (i.e., conventional photolithographic techniques), alternate techniques can be employed, including directing a suitable collimated light beam (e.g., from an excimer laser) at portions of the masking material (e.g., blanket hardened photoresist) sought to be removed, thereby ablating these portions of the masking material, or directly (without the use of a mask) hardening portions of the masking material with a suitable collimated light beam then chemically washing off the non-hardened masking material.

For example, the socket 300 of FIG. 3 would also be useful for making resilient connections to contact areas (bond pads) on semiconductor chips (components), rather than to terminals (external connection points) of LGA-type packages. Such a semiconductor chip could be socketably connected to by substituting the chip, face-down, for the package 304 shown in FIG. 3. Generally, the socket 300 of FIG. 3 can be used for making pressure contact to any electronic component having connection points, bond pads, terminals or the like, disposed on a surface thereof.

For example, the mounting of resilient contact structures within a plated through hole, rather than atop a plated through hole, as illustrated in FIG. 3B, is applicable to either LGA-type sockets or BGA-type sockets, differing principally in the spring shape selected for the resilient contact structure extending from the top surface of the support substrate.

What is claimed is:

1. A mounted conductor for an electronic component comprising:
    a substrate having a first side and a second side;
    a resilient contact structure passing through the substrate to provide a connection on a first side of the substrate and a free standing resilient contact on the second side of the substrate; and
    a connector on the first side of the substrate connected through the connection to the resilient contact structure, wherein the connector comprises a solder ball.

2. The mounted conductor of claim 1 wherein the resilient contact structure comprises a composite structure with a relatively soft core covered by a shell of a material significantly harder than the core.

3. The mounted conductor of claim 1 wherein the resilient contact structure is secured relative to the substrate.

4. The mounted conductor of claim 1 further comprising a plated through hole in the substrate, and the resilient contact structure passes through the plated through hole.

5. The mounted conductor of claim 1 further comprising a plurality of resilient contact structures passing through the substrate, substantially each providing a connection on a first side of the substrate and a free standing resilient contact on the second side of the substrate, and a plurality of connectors on the first side of the substrate, substantially each connected through the connection to a corresponding selected one of the plurality of resilient contact structures.

6. The socket of claim 1, the resilient contact structure further comprising a base portion attached to the connection, and a resilient, elongate, free standing section extending from the base portion.

7. The socket of claim 1, the resilient contact structure further comprising
    an elongate element, of a first material, attached to the connection; and
    a second material deposited on the elongate element, wherein the elongate element without the second material is flexible, and the elongate element and the second material together are resilient.

8. The socket of claim 1, the resilient contact structure further comprising
    (i) a base secured to the connection;
    (ii) a contact region located distant from the substrate on the second side of the substrate; and
    (iii) an elongate freestanding section extending from the base to the contact region, the elongate freestanding section having a first shape and being made of at least one material which allows the elongate free standing section to move under spring action when the contact region is depressed towards the substrate so as to have a second shape, and at least partially return under spring action to the first shape when not depressed.

9. The mounted conductor of claim 1, wherein said resilient contact structure passes through a hole in the substrate, and said hole contains an elastomer.

10. A socket for releasably connecting a first electronic component to a second electronic component, the socket comprising:
    a substrate having a first side and a second side,
    a plurality of resilient contact structures passing through the substrate, substantially each providing a connection on a first side of the substrate and a free standing resilient contact on the second side of the substrate, and
    a plurality of connectors on the first side of the substrate, substantially each connected through the connection to a corresponding selected one of the plurality of resilient contact structures, wherein at least one of the connectors comprises a solder ball.

11. The socket of claim 10 wherein the resilient contact structure comprises a composite structure with a relatively soft core covered by a shell of a material significantly harder than the core.

12. The socket of claim 10 wherein the resilient contact structure is secured relative to the substrate.

13. The socket of claim 10 further comprising the first electronic component secured in the socket and electrically connected to the second electronic component through selected ones of the plurality of resilient contact elements.

14. The socket of claim 10 further comprising a second electronic component, the second electronic component electrically connected to first selected ones of the plurality of resilient contact structures.

15. The method of using the socket of claim 14 by securing a first electronic component in relation to the socket and electrically connecting it to the second electronic component through second selected ones of the plurality of resilient contact elements.

16. A method of using the socket of claim 15 by operating the first electronic component secured in the socket and electrically connected to the second electronic component through the second selected ones of the plurality of resilient contact elements.

17. The socket of claim 10, the resilient contact structure further comprising a base portion attached to the connection, and a resilient, elongate, free standing section extending from the base portion.

18. The socket of claim 10, the resilient contact structure further comprising
   an elongate element, of a first material, attached to the connection; and
   a second material deposited on the elongate element, wherein the elongate element without the second material is flexible, and the elongate element and the second material together are resilient.

19. The socket of claim 10, the resilient contact structure further comprising
   (i) a base secured to the connection;
   (ii) a contact region located distant from the substrate on the second side of the substrate; and
   (iii) an elongate freestanding section extending from the base to the contact region, the elongate freestanding section having a first shape and being made of at least one material which allows the elongate free standing section to move under spring action when the contact region is depressed towards the substrate so as to have a second shape, and at least partially return under spring action to the first shape when not depressed.

20. The socket of claim 10, wherein said plurality of resilient contact structures pass through holes in the substrate, and said holes contain an elastomer.

21. The socket of claim 10 further comprising a plated through hole in the substrate, and the resilient contact structure passes through the plated through hole.

* * * * *